(12) United States Patent
Chen et al.

(10) Patent No.: US 7,567,089 B2
(45) Date of Patent: Jul. 28, 2009

(54) TWO-PART MICROPROBES FOR CONTACTING ELECTRONIC COMPONENTS AND METHODS FOR MAKING SUCH PROBES

(75) Inventors: Richard T. Chen, Burbank, CA (US); Vacit Arat, La Canada Flintridge, CA (US); Chris Folk, Los Angeles, CA (US); Adam L. Cohen, Van Nuys, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

(21) Appl. No.: 11/636,147

(22) Filed: Dec. 7, 2006

(65) Prior Publication Data
US 2007/0205374 A1 Sep. 6, 2007

Related U.S. Application Data

(63) Continuation-in-part of application No. 11/028,960, filed on Jan. 3, 2005, now Pat. No. 7,265,565, which is a continuation-in-part of application No. 10/949,738, filed on Sep. 24, 2004, now abandoned, which is a continuation-in-part of application No. 10/772,943, filed on Feb. 4, 2004, now abandoned.

(60) Provisional application No. 60/748,015, filed on Dec. 8, 2005, provisional application No. 60/611,789, filed on Sep. 20, 2004, provisional application No. 60/609,719, filed on Sep. 13, 2004, provisional application No. 60/582,690, filed on Jun. 23, 2004, provisional application No. 60/582,689, filed on Jun. 23, 2004, provisional application No. 60/540,511, filed on Jan. 29, 2004, provisional application No. 60/536,865, filed on Jan. 15, 2004, provisional application No. 60/533,947, filed on Dec. 31, 2003, provisional application No. 60/533,933, filed on Dec. 31, 2003, provisional application No. 60/506,015, filed on Sep. 24, 2003, provisional application No. 60/445,186, filed on Feb. 4, 2003.

(51) Int. Cl.
*G01R 31/02* (2006.01)
(52) U.S. Cl. .................. 324/754; 324/761; 324/762
(58) Field of Classification Search .................. None
See application file for complete search history.

(56) References Cited

U.S. PATENT DOCUMENTS 5,190,637 A   3/1993   Guckel .................. 205/118

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner*—Minh N Tang
(74) *Attorney, Agent, or Firm*—Dennis R. Smalley

(57) ABSTRACT

Embodiments disclosed herein are directed to compliant probe structures for making temporary or permanent contact with electronic circuits and the like. In particular, embodiments are directed to various designs of two-part probe elements, socket-able probes and their mounts. Some embodiments are directed to methods for fabricating such probes and mounts. In some embodiments, for example, probes have slide in mounting structures, twist in mounting structures, mounting structures that include compliant elements, and the like.

7 Claims, 21 Drawing Sheets

U.S. PATENT DOCUMENTS

| | | | | |
|---|---|---|---|---|
| 5,286,208 | A | 2/1994 | Matsuoka | 439/72 |
| 5,476,211 | A | 12/1995 | Khandros | 228/180.5 |
| 5,545,045 | A | 8/1996 | Wakamatsu | 439/70 |
| 5,599,194 | A | 2/1997 | Ozawa et al. | 439/72 |
| 5,772,451 | A | 6/1998 | Dozier et al. | 439/70 |
| 5,806,181 | A | 9/1998 | Khandros et al. | 29/874 |
| 5,811,982 | A | 9/1998 | Beaman et al. | 324/762 |
| 5,820,014 | A | 10/1998 | Dozier et al. | 228/56.3 |
| 5,829,128 | A | 11/1998 | Eldridge et al. | 29/855 |
| 5,917,707 | A | 6/1999 | Khandros et al. | 361/776 |
| 5,974,662 | A | 11/1999 | Eldridge et al. | 29/842 |
| 5,994,152 | A | 11/1999 | Eldridge et al. | 29/842 |
| 6,023,103 | A | 2/2000 | Chang et al. | 257/781 |
| 6,027,630 | A | 2/2000 | Cohen | 205/135 |
| 6,043,563 | A | 3/2000 | Eldridge et al. | 257/784 |
| 6,064,213 | A | 5/2000 | Khandros et al. | 324/754 |
| 6,184,053 | B1 | 2/2001 | Eldridge et al. | 438/52 |
| 6,208,225 | B1 | 3/2001 | Miller | 333/202 |
| 6,218,910 | B1 | 4/2001 | Miller | 333/33 |
| 6,268,015 | B1 | 7/2001 | Mathieu et al. | 427/96 |
| 6,278,284 | B1 * | 8/2001 | Mori et al. | 324/755 |
| 6,336,269 | B1 | 1/2002 | Eldridge et al. | 29/885 |
| 6,344,752 | B1 | 2/2002 | Hagihara et al. | 324/754 |
| 6,426,638 | B1 | 7/2002 | Di Stefano | 324/754 |
| 6,441,315 | B1 | 8/2002 | Eldridge et al. | 174/260 |
| 6,456,099 | B1 | 9/2002 | Eldridge et al. | 324/754 |
| 6,482,013 | B2 | 11/2002 | Eldridge et al. | 439/66 |
| 6,483,328 | B1 | 11/2002 | Eldridge et al. | 324/754 |
| 6,491,968 | B1 | 12/2002 | Mathieu et al. | 29/842 |
| 6,509,751 | B1 | 1/2003 | Mathieu et al. | 324/754 |
| 6,520,778 | B1 | 2/2003 | Eldridge et al. | 439/66 |
| 6,539,531 | B2 | 3/2003 | Miller et al. | 716/15 |
| 6,627,483 | B2 | 9/2003 | Ondricek et al. | 438/117 |
| 6,640,415 | B2 | 11/2003 | Eslamy et al. | 29/593 |
| 6,672,875 | B1 | 1/2004 | Mathieu et al. | 439/66 |
| 6,676,438 | B2 * | 1/2004 | Zhou et al. | 439/482 |
| 6,690,185 | B1 | 2/2004 | Khandros et al. | 324/758 |
| 6,705,876 | B2 | 3/2004 | Eldridge | 439/66 |
| 6,713,374 | B2 | 3/2004 | Eldridge et al. | 438/611 |
| 6,729,019 | B2 | 5/2004 | Grube et al. | 29/830 |
| 6,771,084 | B2 | 8/2004 | Di Stefano | 324/754 |
| 6,794,890 | B1 | 9/2004 | Tokumo et al. | 324/761 |
| 6,811,406 | B2 | 11/2004 | Grube | 439/66 |
| 6,817,052 | B2 | 11/2004 | Grube | 15/3 |
| 6,838,893 | B2 | 1/2005 | Khandros, Jr. et al. | 324/754 |
| 6,856,156 | B2 | 2/2005 | Liang et al. | 324/758 |
| 6,945,827 | B2 | 9/2005 | Grube et al. | 439/700 |
| 6,967,493 | B2 * | 11/2005 | Mori et al. | 324/754 |
| 7,265,565 | B2 * | 9/2007 | Chen et al. | 324/762 |
| 2002/0017915 | A1 | 2/2002 | Kamiya | 324/754 |
| 2005/0108876 | A1 * | 5/2005 | Mathieu et al. | 29/854 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

* cited by examiner

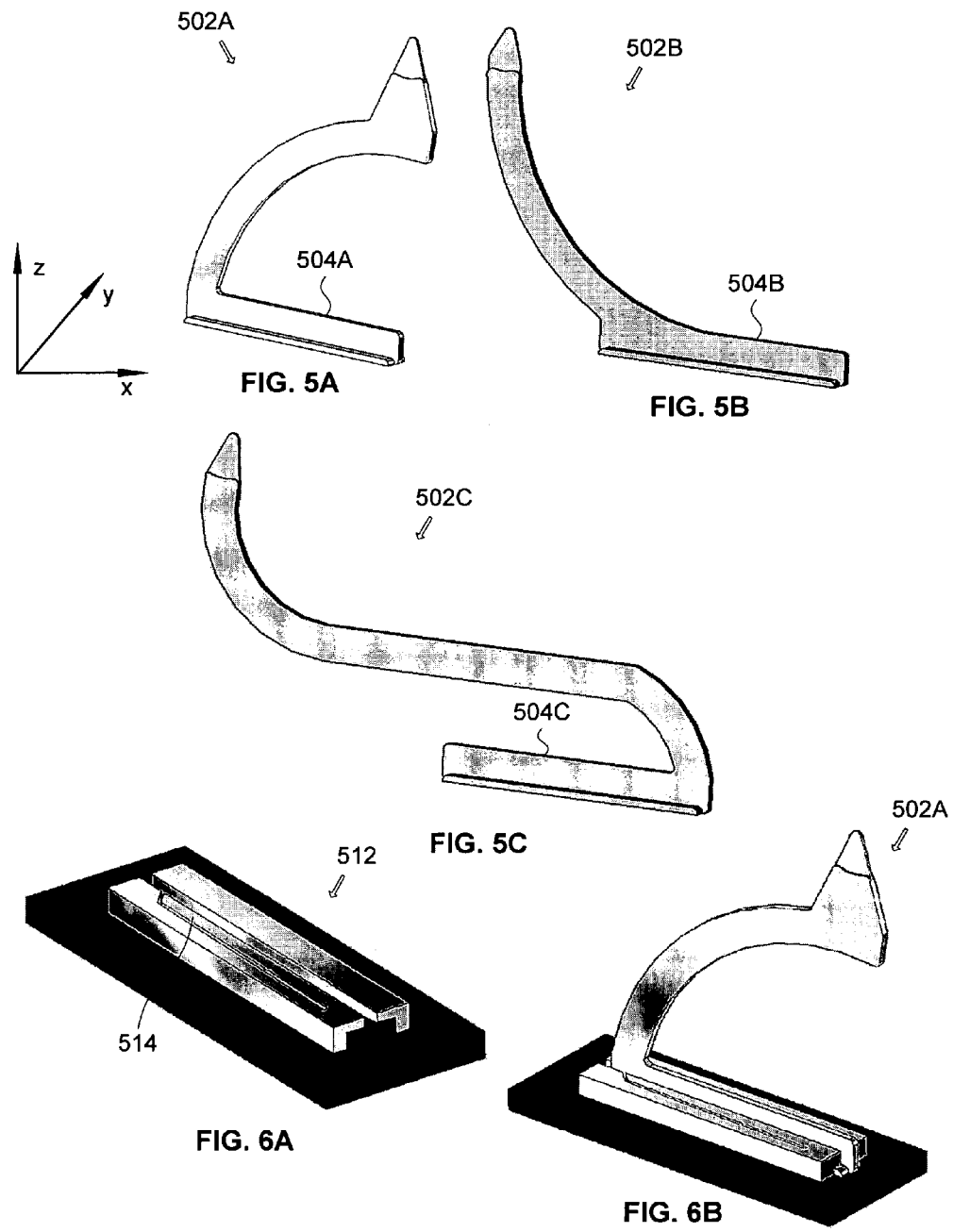

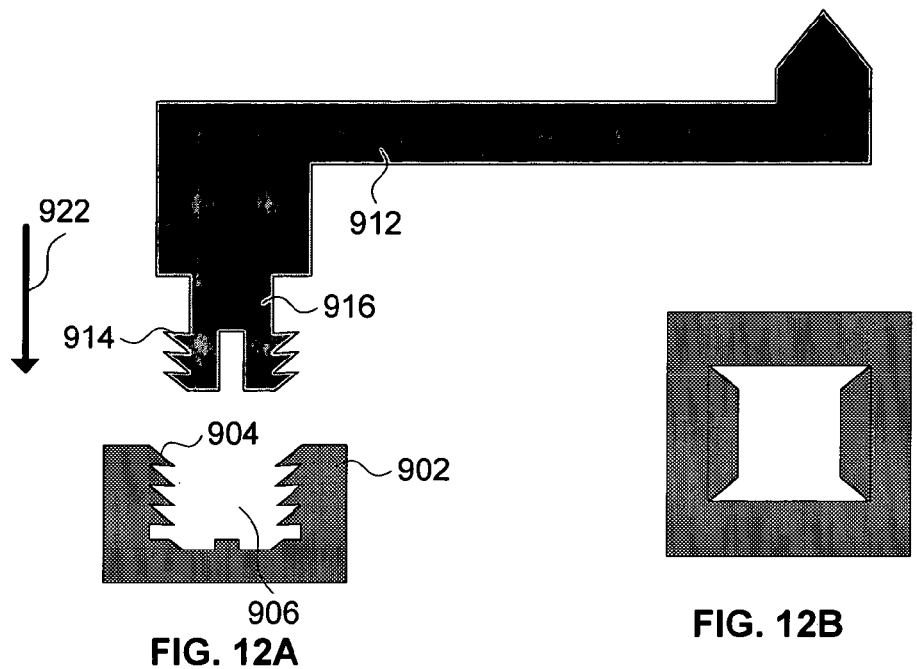
FIG. 12A
FIG. 12B
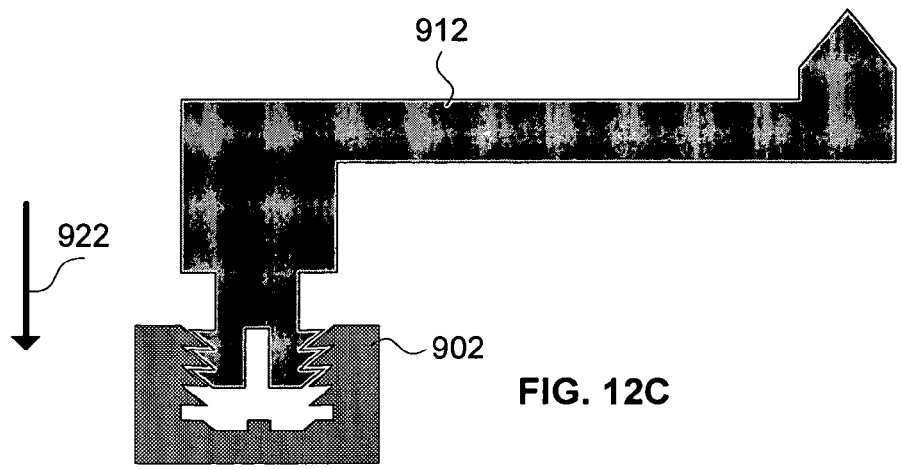
FIG. 12C
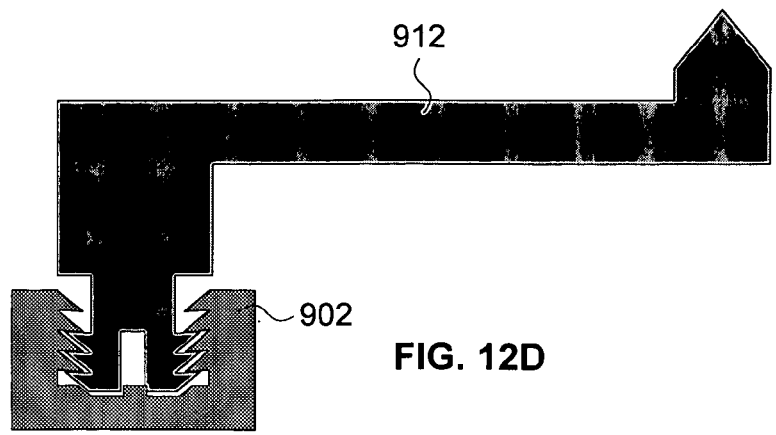
FIG. 12D

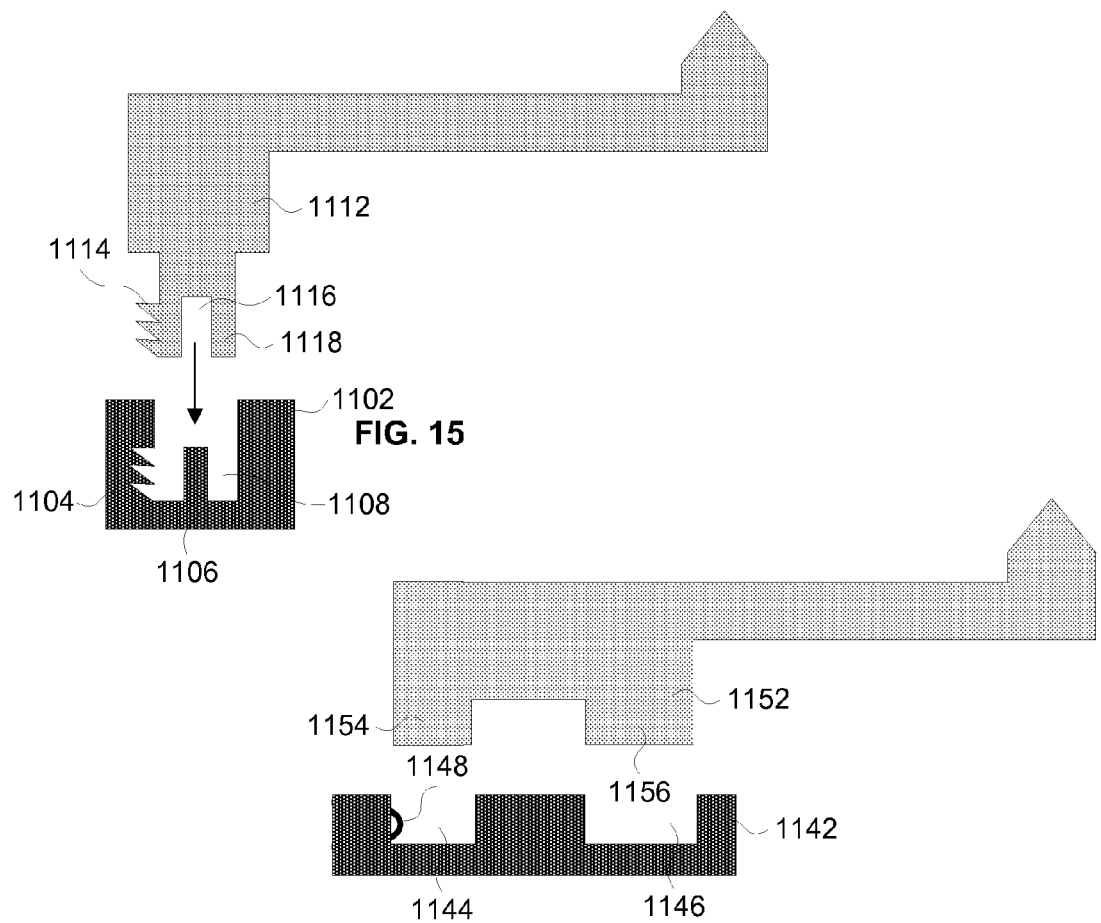
FIG. 15
FIG. 16
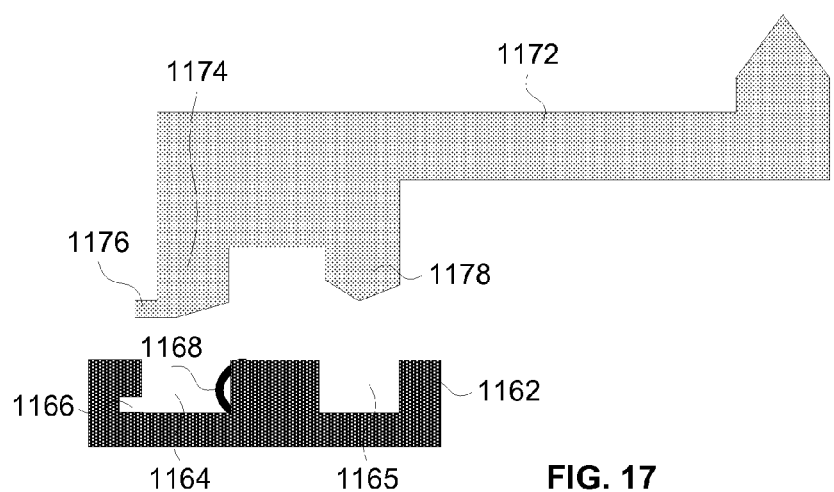
FIG. 17

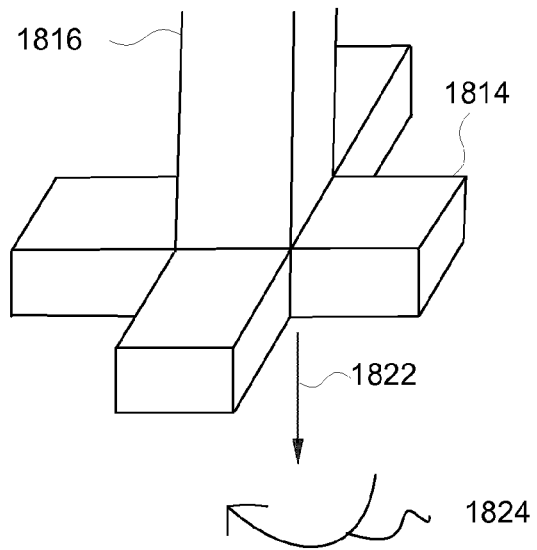
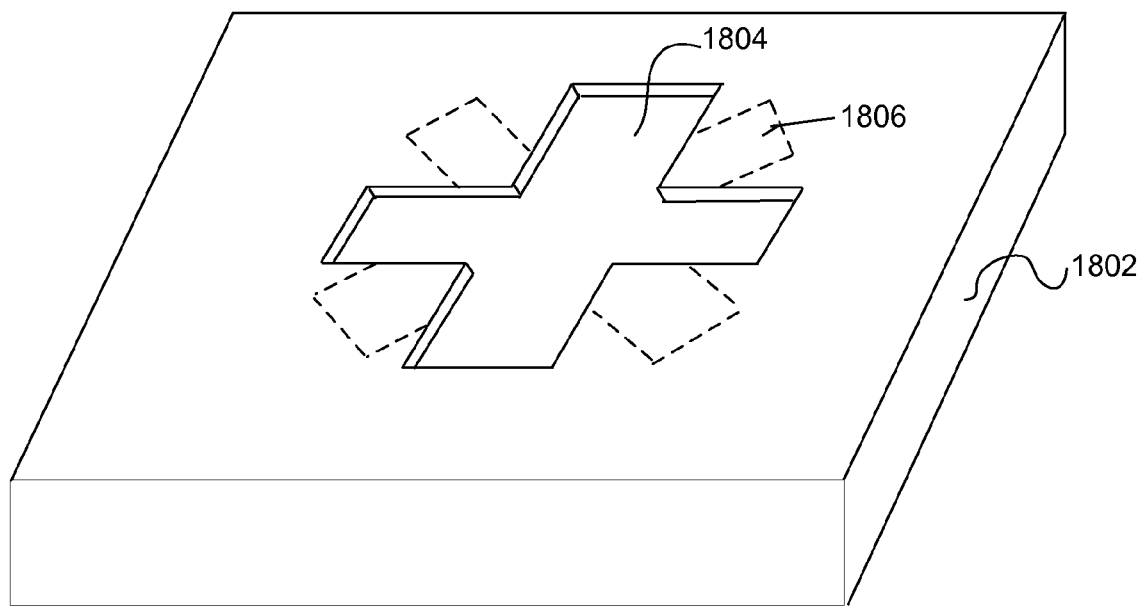
FIG. 24

TWO-PART MICROPROBES FOR CONTACTING ELECTRONIC COMPONENTS AND METHODS FOR MAKING SUCH PROBES

RELATED APPLICATIONS

This application claims benefit of U.S. Provisional Patent Application No. 60/748,015 filed Dec. 8, 2005 and is a continuation-in-part of U.S. patent application Ser. No. 11/028,960, now U.S. Pat. No. 7,265,565, which was filed on Jan. 3, 2005 now U.S. Pat. No. 7,265,565 and which in turn claims benefit of U.S. Provisional Application Nos. 60/582,689, filed Jun. 23, 2004 60/582,690, filed Jun. 23, 2004 60/609,719, filed Sep. 13, 2004 60/611,789, filed Sep. 20, 2004 60/540,511, filed Jan. 29, 2004, 60/533,933, filed Dec. 31, 2003 60/536,865, filed Jan. 15, 2004 and 60/533,947. The application is also a continuation-in-part of U.S. application Ser. No. 10/949,738 filed Sep. 24, 2004, now abandoned, which in turn is a continuation-in-part of U.S. patent application Ser. No. 10/772,943, filed Feb. 4, 2004, now abandoned, which in turn claims benefit of U.S. Provisional Application Nos. 60/445,186 filed Feb. 4, 2003; 60/506,015 filed Sep. 24, 2003; 60/533,933 filed Dec. 31, 2003, and 60/536,865 filed Jan. 15, 2004; furthermore the '738 application claims benefit of U.S. Application Nos. 60/506,015 filed Sep. 24, 2003 ; 60/533,933 filed Dec. 31, 2003; and 60/536,865 filed Jan. 15, 2004. Each of these applications is incorporated herein by reference as if set forth in full herein including any appendices attached thereto.

FIELD OF THE INVENTION

Embodiments of the present invention relate to microprobes (e.g. for use in the wafer level testing of integrated circuits, such as memory or logic devices), and more particularly related to two-part microprobes. In some embodiments, microprobes are fabricated using electrochemical fabrication methods (e.g. EFAB®fabrication processes).

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Van Nuys, Calif. under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Van Nuys, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fullydense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost-Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-EI-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIG. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Furthermore, U.S. application Ser. Nos. 11/029,219 and 11/029,171, both filed Jan. 3, 2005 are incorporated by reference.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical fabrication provides the ability to form prototypes and commercial quantities of miniature objects, parts, structures, devices, and the like at reasonable costs and in reasonable times. In fact, electrochemical fabrication is an enabler for the formation of many structures that were hitherto impossible to produce. Electrochemical fabrication opens the spectrum for new designs and products in many industrial fields. Even though electrochemical fabrication offers this new capability and it is understood that electrochemical fabrication techniques can be combined with designs and structures known within various fields to produce new structures, certain uses for electrochemical fabrication provide designs, structures, capabilities and/or features not known or obvious in view of the state of the art.

A need exists in various fields for miniature devices having improved characteristics, reduced fabrication times, reduced fabrication costs, simplified fabrication processes, and/or more independence between geometric configuration and the selected fabrication process. A need also exists in the field of miniature device fabrication for improved fabrication methods and apparatus.

SUMMARY OF THE INVENTION

It is an object of some embodiments of the invention to provide two-part probes with improved characteristics.

It is an object of some embodiments of the invention to provide two-part probes that are more reliable.

It is an object of some embodiments of the invention to provide improved methods for fabricating probes.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object of the invention ascertained from the teachings herein. It is not necessarily intended that all objects be addressed by any single aspect of the invention even though that may be the case with regard to some aspects.

In a first aspect of the invention a probe assembly for making electric contact with an electronic circuit element, including: a substrate including at least one structure; at least one probe including: a contact tip portion; a compliant portion functionally attached to the tip portion; and a base portion functionally attached to the compliant portion, wherein the base portion is configured to mate with and be at least partially mechanically constrained by its physical configuration and the physical configuration of the at least one structure on the substrate.

In a first aspect of the invention an array of cantilever probes for making contact with an electronic circuit element, include: a plurality of independent cantilever probes, each having a base portion, a support functionally connected to the base portion, a cantilever portion functionally connected to the support, and a contact portion functionally connected to the cantilever portion for making contact with the electronic circuit element; a substrate containing at least two bonding location for each of the plurality of cantilever probes; and a bonding material functionally attaching base portions of the cantilever probes to their respective bonding locations on said substrate, wherein for at least a plurality of pairs of first and second cantilever probes, an opening is provided in a base of the first probe between the at least two bonding locations such that the opening provides a space for bonding for the second probe to be used in bonding the second probe to the substrate without the bonding material for the second probe shorting to the base of first probe whereby interlaced bonding locations for a plurality of probes are provide.

In a second aspect of the invention, a probe mounted to a substrate for testing semiconductor devices, includes: (a) a substrate; (b) a mounting element mounted to the substrate; (c) a probe element comprising a body portion, having a distal end connected to a tip portion, and a proximal end connected to a base portion; wherein the base portion and the mounting element have at least some substantially complementary elements which allow aligned and retained mating of the probe to the mount.

Further aspects of the invention will be understood by those of skill in the art upon reviewing the teachings herein. Other aspects of the invention may involve apparatus and methods used in implementing one or more of the above noted aspects of the invention or involve methods for fabricating structures according to various apparatus aspects set forth above. These other aspects of the invention may provide various combinations of the aspects, embodiments, and associated alternatives explicitly set forth herein as well as provide other configurations, structures, functional relationships, and processes that have not been specifically set forth above.

BRIEF DESCRIPTION OF THE DRAWINGS

FIGS. 5A-5C depict perspective views of cantilever structures having base elements with "L" shaped structures that can slide into and interlock with appropriate base structures affixed to or forming part of a substrate.

FIG. 6A depicts a slotted mounting structure on a substrate into which a probe with an "L" or "T" shaped base may be inserted while FIG. 6B depicts a perspective view of such a probe slid into the slotted mounting structure FIG. 7A depicts an alternative mounting structure configuration while

FIGS. 12A-12D depict a probe and mount according to another alternative embodiment of the invention where the probe and mount are shown in various separated and engaged positions and where the probe includes a post element that includes elastic finger that can be slide past similar fingers located within a rcess in the mount.

FIG. 15-17 depicts side views of additional embodiments of probe mounts and probes that can be mated and locked together where FIG. 15 shows a probe as having a plurality of elastic fingers that can mat with a corresponding recession in a mount and FIGS. 16 and 17 show bases containing openings for receiving probe legs or posts and where the base includes compliant elements for holding the probe and base together.

FIG. 24 includes a probe base/post configuration and mount configuration that allows for vertical loading followed by a twisting motion that locks the probe and the mount together.

DETAILED DESCRIPTION OF PREFERRED EMBODIMENTS OF THE INVENTION

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
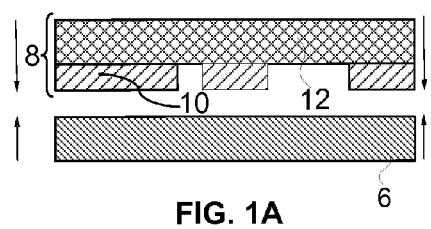
FIGS. 1A-1C schematically depict side views of various stages of a CC mask plating process, while FIGS. 1D-1G schematically depict a side views of various stages of a CC mask plating process using a different type of CC mask.
Figure 1B:
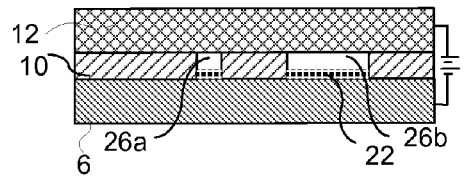
Figure 1C:
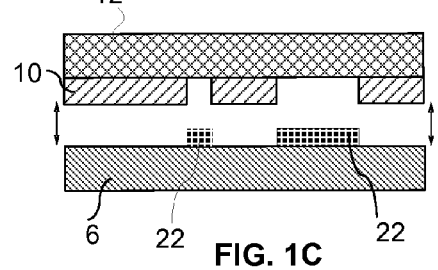
Figure 1D:
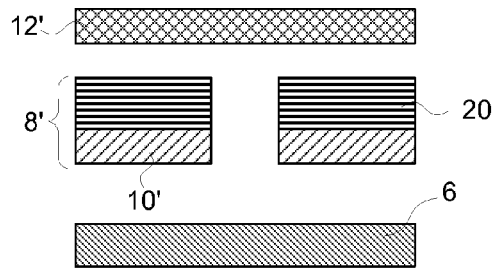
Figure 1E:
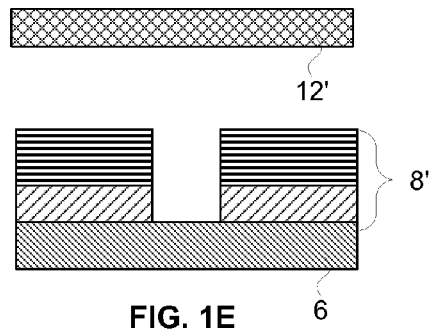
Figure 1F:
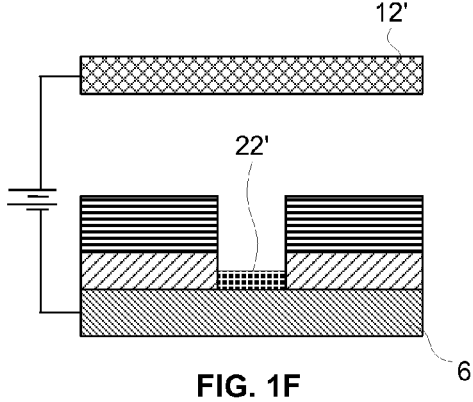
Figure 1G:
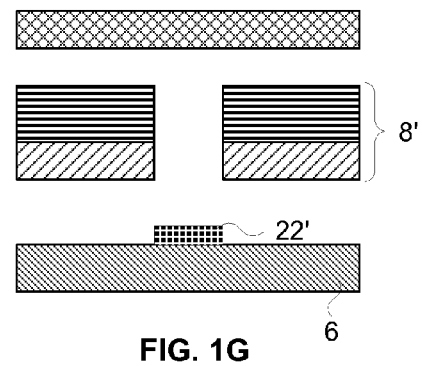
Figure 2A:
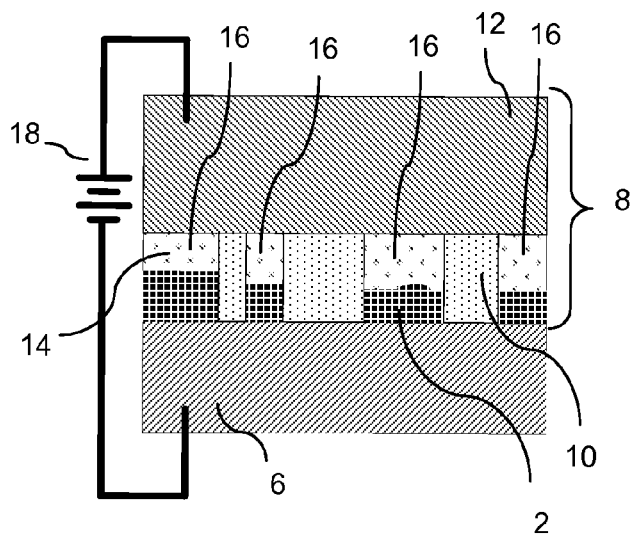
FIGS. 2A-2F schematically depict side views of various stages of an electrochemical fabrication process as applied to the formation of a particular structure where a sacrificial material is selectively deposited while a structural material is blanket deposited.
Figure 2B:
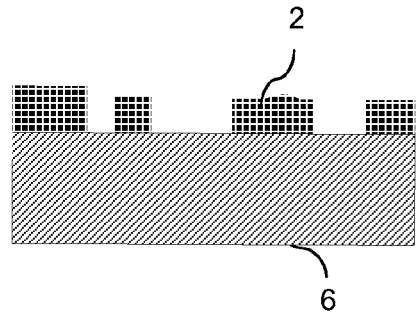
Figure 2C:
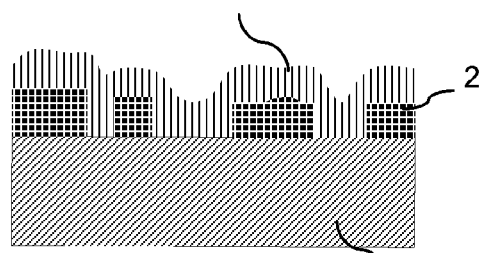
Figure 2D:
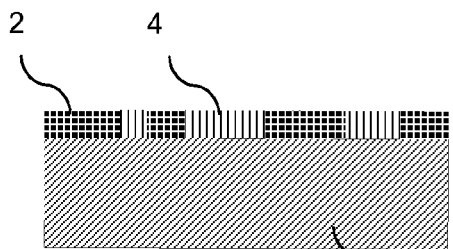
Figure 2E:
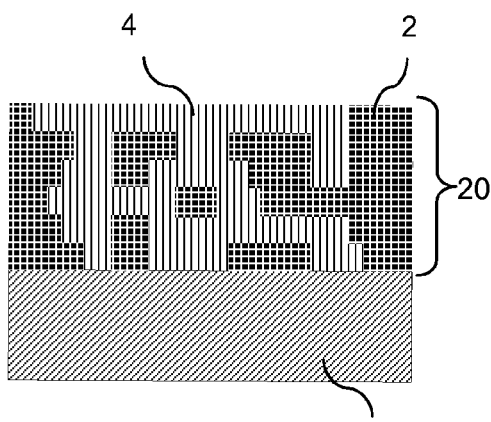
Figure 2F:
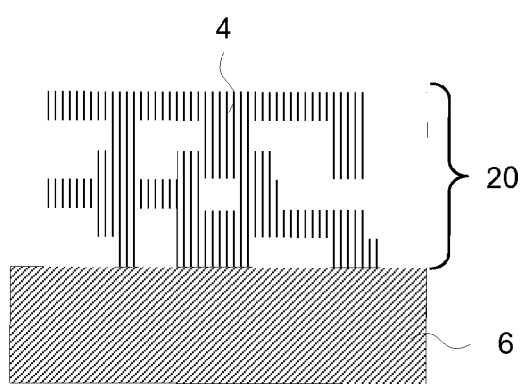
Figure 3A:
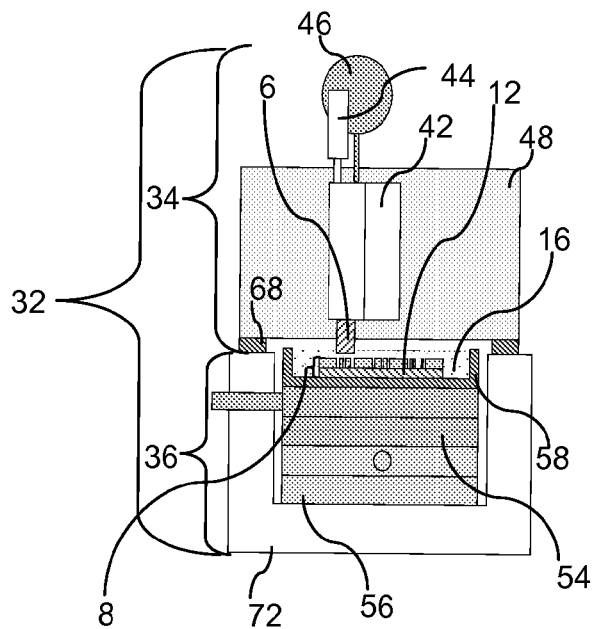
FIGS. 3A-3C schematically depict side views of various example apparatus subassemblies that may be used in manually implementing the electrochemical fabrication method depicted in FIGS. 2A-2F.
Figure 3B:
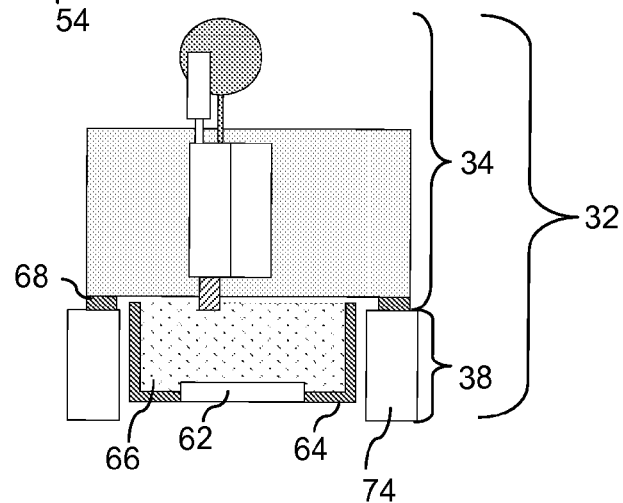
Figure 3C:
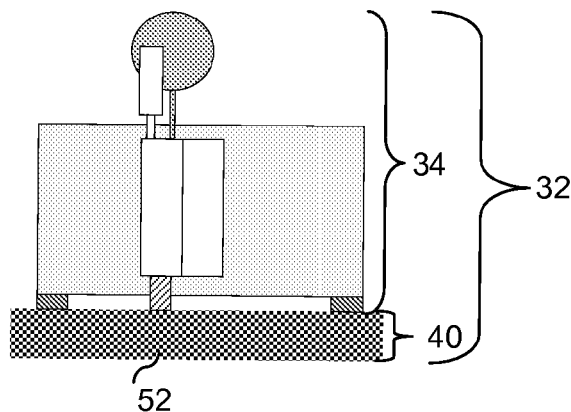
Figure 4A:
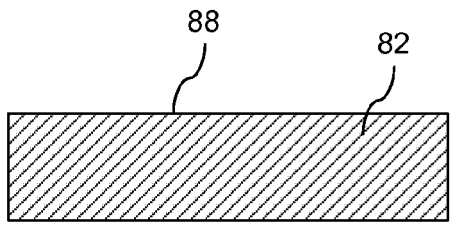
FIGS. 4A-4F schematically depict the formation of a first layer of a structure using adhered mask plating where the blanket deposition of a second material overlays both the openings between deposition locations of a first material and the first material itself
Figure 4B:
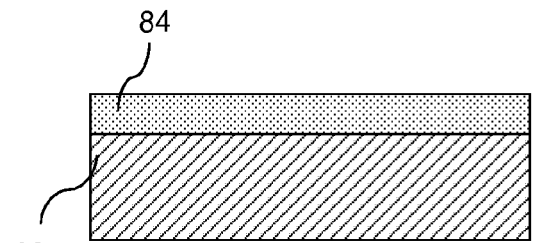
Figure 4C:
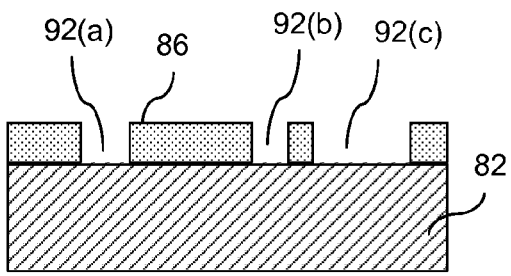
Figure 4D:
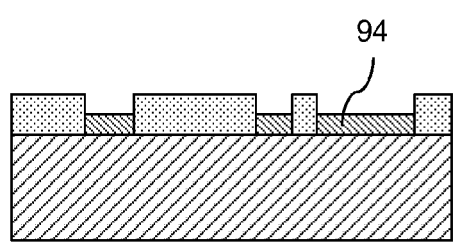
Figure 4E:
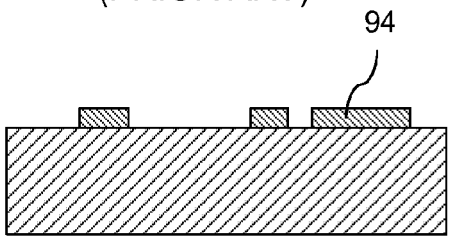
Figure 4F:
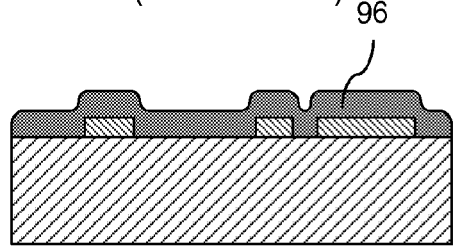
Figure 4G:
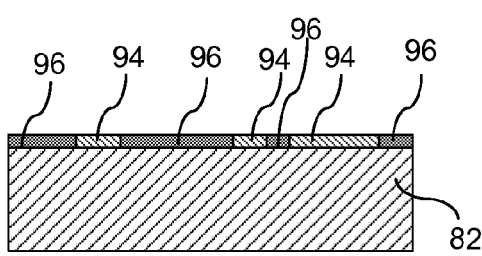
FIG. 4G depicts the completion of formation of the first layer resulting from planarizing the deposited materials to a desired level.
Figure 4H:
FIGS. 4H and 4I respectively depict the state of the process after formation of the multiple layers of the structure and after release of the structure from the sacrificial material.
Figure 4I:
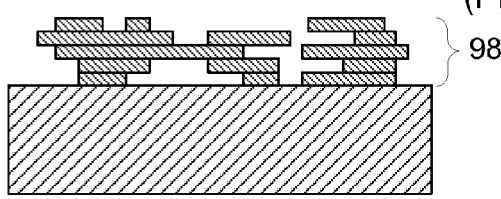

FIGS. 4A-4G illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may be combined with or be implemented via electrochemical fabrication techniques. Such combinations or implementations may be used to form multi-layer structures using a single patterning technique on all layers or using different patterning techniques on different layers. For example, different types of patterning masks and masking techniques may be used or even techniques that perform direct selective depositions may be used without the need for masking. For example, conformable contact masks may be used during the formation of some layers or during some selective deposition or etching operations while non-conformable contact masks may be used in association with the formation of other layers or during other selective deposition or etching operations. Proximity masks and masking operations (i.e. operations that use masks that at least partially selectively shield a substrate by their proximity to the substrate even if contact is not made) may be used, and adhered masks and masking operations (masks and operations that use masks that are adhered to a substrate onto which selective deposition or etching is to occur as opposed to only being contacted to it) may be used.

In many embodiments, cantilever probes offer good compliance and may be formable from fewer layers than is required for forming vertically extending probes (see for example U.S. patent application Ser. Nos. 60/603,030, 10/772,943 and 60/641,341, each of which is incorporated herein by reference) but at the cost of consuming more substrate area. In some situations cantilevered probes may be more preferred than vertically extending probes while in other situations the reverse may be true.

In some embodiments, the simple cantilever structures depicted may be replaced by more complex or sophisticated structures. Cantilever elements may have more complex configurations. In some embodiments the cantilever elements may be replaced by vertical probe elements (i.e. probes that have bases and tips that are substantially aligned along the primary axis of the movement of the probe tip during compression or elongation of the compliant element or elements of the probe.

Some embodiments of the present invention provide cantilever structures that have base elements which can be made to interlock with structures on a substrate so as to limit or restrain movement between the base and the substrate in a Z direction and to limit or restrain movement of the base relative to the substrate along a dimension which is perpendicular to the Z direction. These interlocking base structures may or may no have portions which extend beyond the riser portion of the cantilever probe.

FIGS. 5A-5C depict examples of cantilever structures 502A-502C which have base elements 504A-504C which have "L" shapes and which may be made to slide into a slotted structure on a substrate and particularly a slotted structure that has an undercut into which the base of the "L" may slide into. Such a base structure is depicted in FIG. 6A while FIG. 6B depicts probe structure 502A which has been slid into slotted structure 512 of FIG. 6A.

Slotted structure 512 of FIG. 6A includes a cantilever element 514 which offers some compliance and a snug fit as a probe element is slid into place. In some embodiments, the base structure of a probe element may take on an "L" shape configuration while in other embodiments the base structure may have an upside down "T" configuration such that when slid into a base element the structure is locked into place on each side of the cantilever element. A "T" shaped configuration is more clearly seen on the base elements of probe elements 602A, 602B and 602C of FIG. 8.

Once slid into place the probe elements may be held in position and in electrical contact with the substrate by frictional forces or alternatively they may be locked into place by an appropriate mechanical mechanism. In still other embodiments the probe elements may be bonded to the base structures by solder or conductive epoxy or the like. In some embodiments the probe elements may be removable (if damaged) so that a replacement element may be inserted. Such replacement may occur by simply reversing the motion that led to mating in the first place, or by releasing locking elements or by heating to melt a bonding material or controlled etching to remove a bonding material or the like.

Figure 7A:
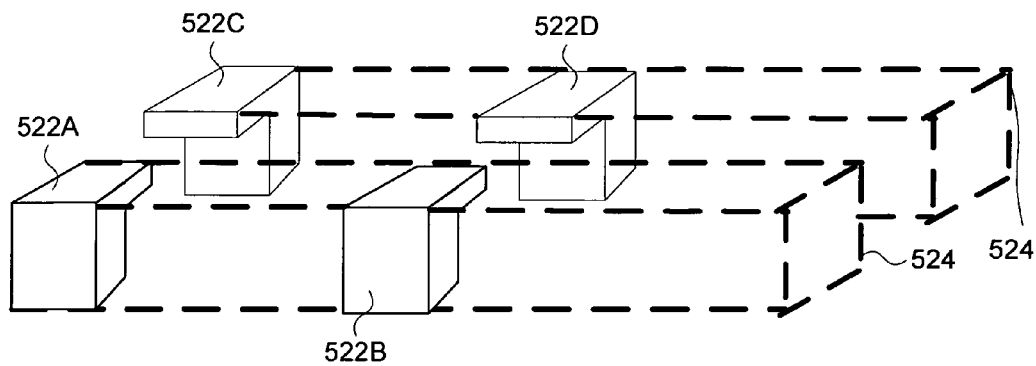

FIG. 7A depicts a perspective view of a mounting structure that includes four clips 522A-522D as opposed to the two slots of FIG. 6A. FIG. 7A shows where a slotted base structure like 512 of FIG. 6A would be located using dashed outlines 524. In the embodiment of FIG. 7A, two clips hold down each side of a "T" shaped base structure. In some alternative embodiments, it may be sufficient to have a single pair of clips hold a probe having an "L" or "T" shaped base structure or having a base structure having tabs that extend from an elongated base in those locations where clips are to be located.

Figure 7B:
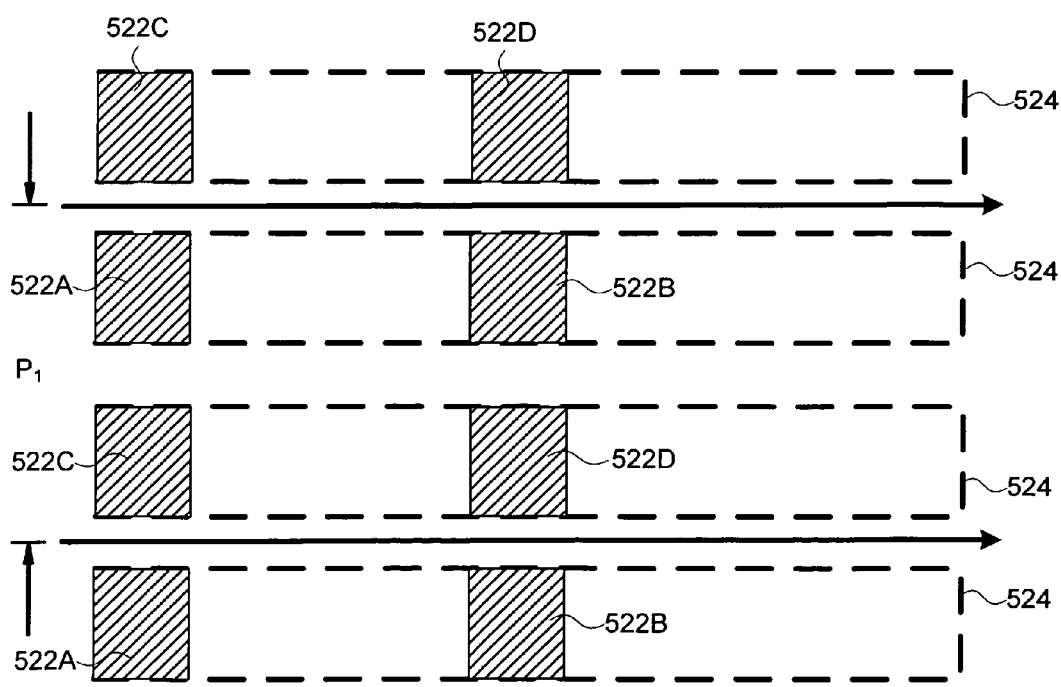
FIGS. 7B and 7C depict two alternative configurations for locating the mounting structures in forming arrays of various pitch.
Figure 7C:
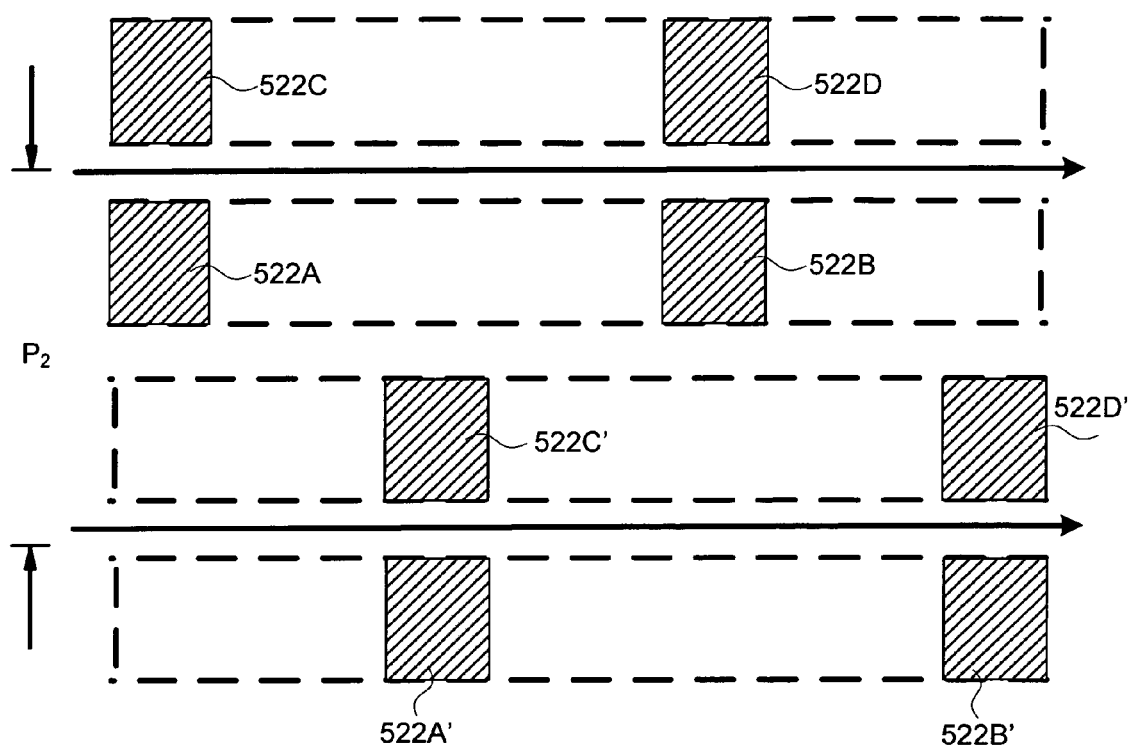

FIG. 7B depicts a top view of two sets of clip elements 522A-522D for two adjacent cantilever probes that are to be located with a pitch corresponding to distance $P_1$. With the clips aligned with one another for holding adjacent probes, the probes can not be formed any closer together because of a minimum feature size limitation. FIG. 7C depicts a top view of two sets of clip elements 522A-522D for two adjacent cantilever probes where the locations of the clips have been shifted so that they may be located closer together thereby allowing probes held by the sets of clips to be located at a distance $P_2$ from one another which is smaller than distance $P_1$.

The probe elements of FIGS. 5A-5C or other probe elements of some embodiments of the present invention may be formed in an upright position (i.e. with the height extending in the vertical or Z direction and with layers being formed parallel to the XY plane. In other embodiments the structures may be formed lying sideways such that fewer layers are necessary to form the structures. If formed on their sides multiple probes may be formed above one another and interlacing of probe elements may occur to greatly improve fabrication efficiency and yield.

Clip or retention elements into which probe elements will have their bases inserted may be formed directly on space transformers or other desired substrates or may alternatively be transferred to space transformers or other desired substrates using transfer techniques disclosed in a number of the applications set forth below.

Figure 8:
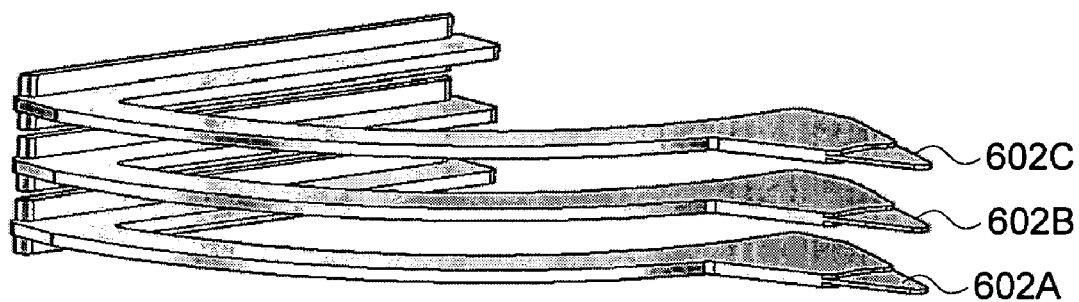
FIG. 8 depicts a perspective view of a plurality of probe elements lying in a sideways orientation and stacked one above the other as they may be formed according to some embodiments of the invention.

FIG. 8 depicts probe elements 602A-602C lying in a sideways orientation and stacked one above the other as they may be formed according to some embodiments of the invention.

In some embodiments, it may be possible to form and transfer probe elements in groups while in other embodiments, transfer of probe structures to space transformers or other desired substrates may occur manually or by pick-and-place machines.

Figure 9:
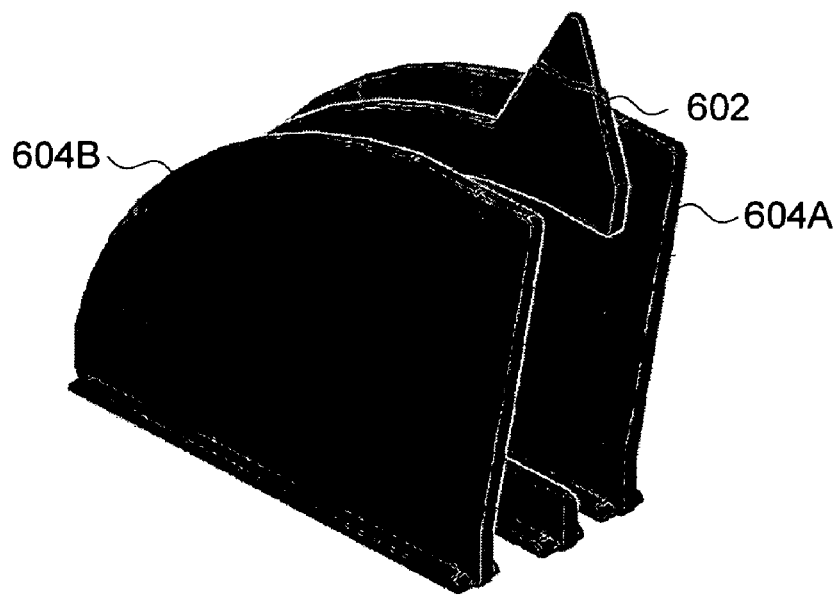
FIG. 9 depicts a perspective view of an example of an alternative embodiment where probe elements are separated from other probe elements by shields.

FIG. 9 depicts an alternative embodiment of the invention where each probe element 602 or selected probe elements 602 are separated from other probe elements by shields 604A and 604B. These shield elements may provide improved impedance characteristics for the signals that will be carried by probes 602. Shield elements 604A and 604B may be formed by techniques similar to those used in forming probe elements 602. In some embodiments as previously noted, probe elements may be made to mechanically lock into position on base structures.

Figure 10A:
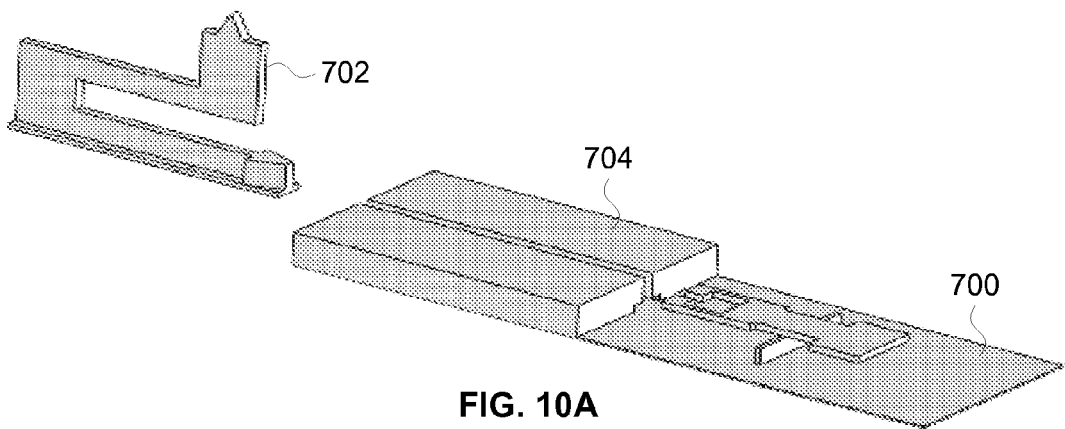
FIGS. 10A-10C provide perspective views of an example of a probe element having a protrusion on its base which may be slid into retention structure on a substrate and locked in place by a locking element.
Figure 10B:
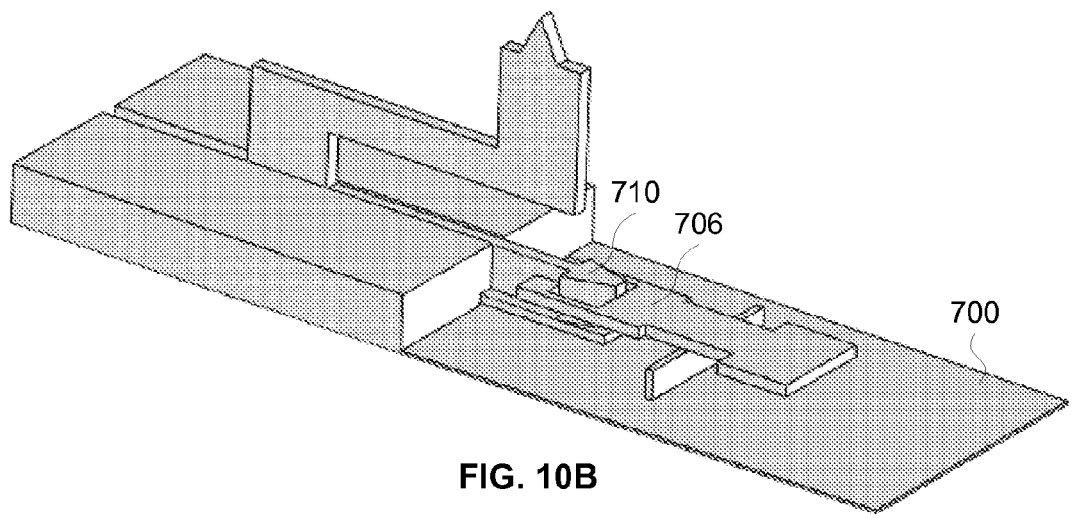
Figure 10C:
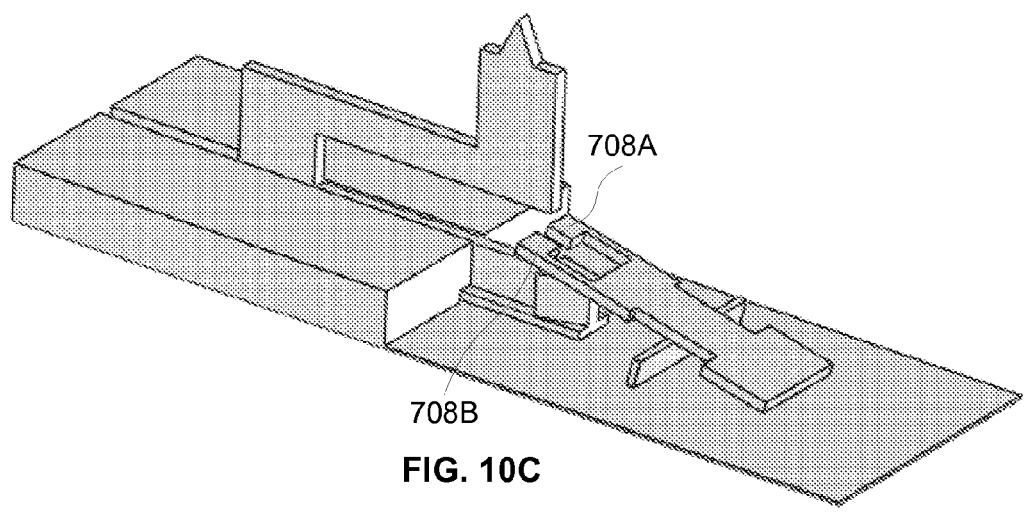
Figure 11A:
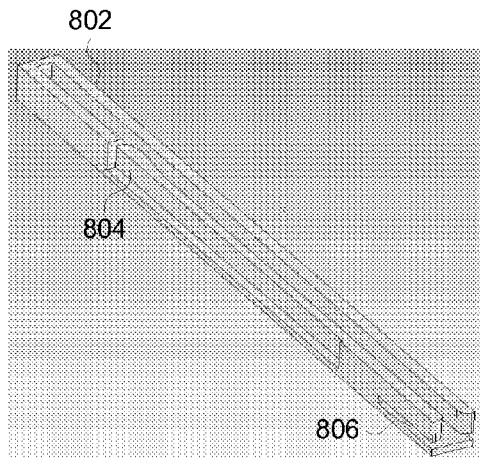
FIGS. 11A-11D depict a probe and mount where the probe and mount are shown as separated and engaged in the various figures and where the mount includes a sideways deflectable cantilever arm that includes a protrusion that is capable of locking a probe into a desired position and further includes recesses for constraining the vertical motion of a probe once it is loaded into the mount.
Figure 11C:
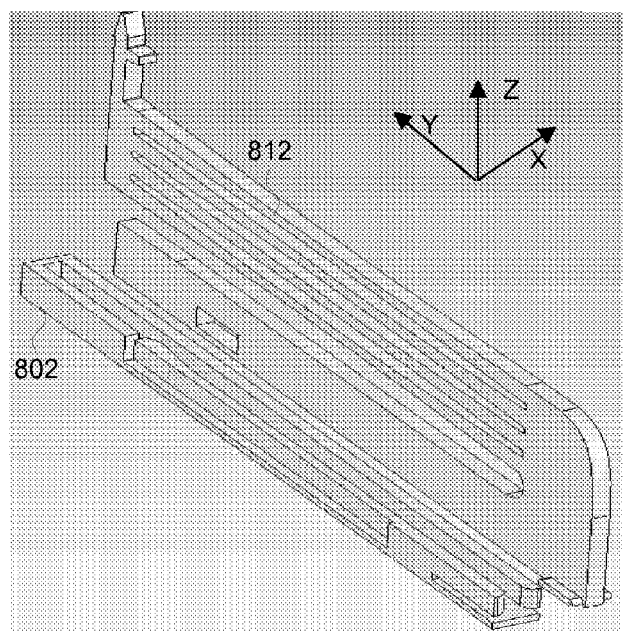
Figure 11B:
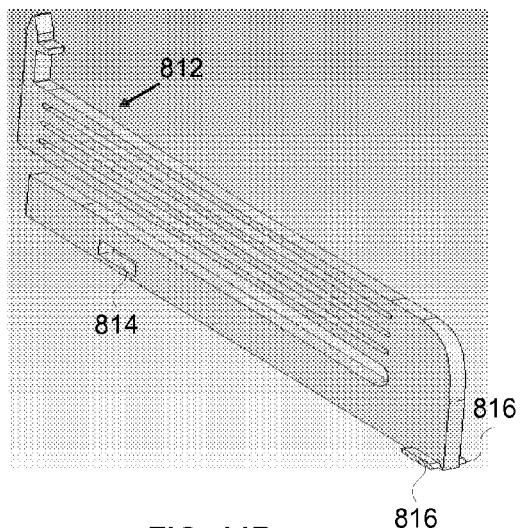
Figure 11D:
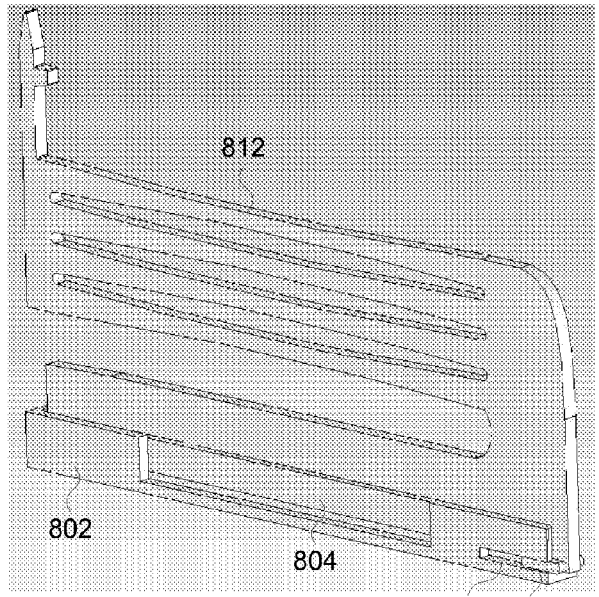

FIGS. 10A-10C show an example of a probe element 702, having a protrusion 710 on its base, which may be slid into retention structure 704 on a substrate 700 and locked in place by locking element 706 which may be rotated up and down. When locking element 706 is in the down position probe element 402 may be slid into position causing arms 708A and 708B to split apart and then reseat around protrusion 710. If the probe element 702 needs to be replaced, locking mechanism 708 may be rotated to an upper position which releases element 710 and allows probe 702 to be removed from base 704. In another alternative embodiment the cantilever element 514 of base 512 of FIG. 6A may have a locking element located at its distal end which may be used to engage a hole or notch in a base element, thus locking the probe and base together once the desired mating position is reached.

Release of the probe element may occur by a tab or other mechanism which would allow cantilever portion 514 to rotate upward (not shown). It should be understood that other locking elements may be used in fixing probe elements in desired positions relative to otherwise unrestrained directions of motion. Such elements may exist on the base structure itself as discussed with regard to FIG. 6A may exist on the backside of base structure as discussed in association with FIGS. 10A-10C, or alternatively, they may be located on the entry side of the base structure. Such locking elements on the entry side might be spring-loaded elements that may be momentarily pushed aside to allow the probe element to be mated with the base and thereafter may be allowed to move back into a locking position.

FIGS. 11A-11D depict a probe 812 and mount 802 where the probe and mount are shown as separated and engaged in the various figures and where the mount 802 includes a sideways deflectable cantilever arm 804 having a distal protrusion that is capable of locking a probe 812 into a desired position and further includes recesses 806 for constraining the vertical motion of a probe once it is loaded into the mount. As can be seen in the FIGS. probe 812 includes recess 814 for receiving the distal protrusion when it is properly loaded into the mount and further more includes wings 816 for engaging recesses 806.

FIGS. 12A-12D depict a probe 912 and mount 902 according to another alternative embodiment of the invention where the probe and mount are shown in various separated and engaged positions and where the probe includes a post element 916 that includes elastic fingers 914 that can be slid past similar fingers 904 located within a recess 906 in mount 902. Loading of the probe into the mount occurs by relative motion in the direction indicated by arrow 922.

Figure 13A:
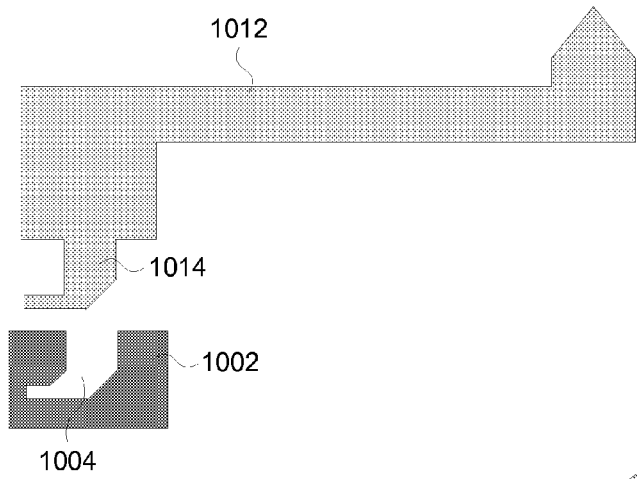
FIGS. 13A-13C depict a probe and mount according to another alternative embodiment of the invention where the probe and mount are shown in various separated and engaged positions and where the probe includes a post configuration that may be loaded into a corresponding mount using motions that are orientated at angles offset from the vertical and horizontal.
Figure 13B:
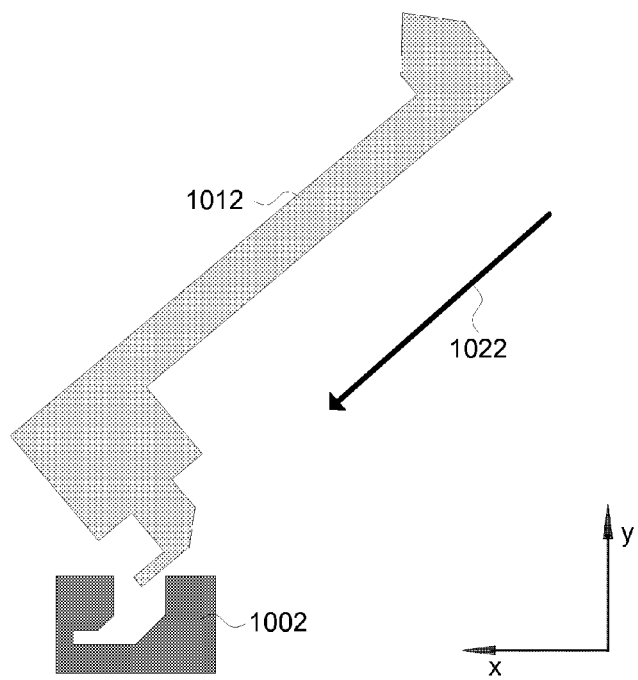
Figure 13C:
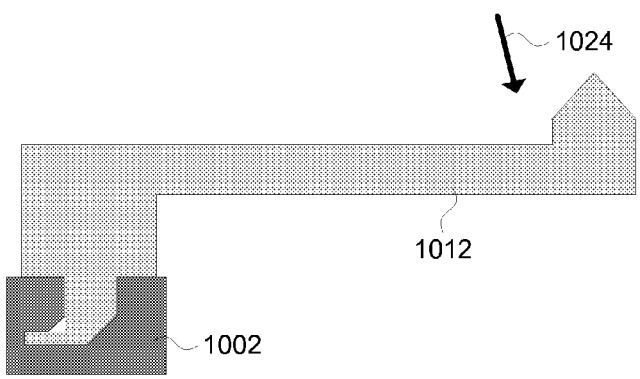

FIGS. 13A-13C depict a probe 1012 and mount 1002 according to another alternative embodiment of the invention where the probe 1012 and mount 1002 are shown in various separated and engaged positions and where the probe 1012 includes a post configuration 1014 that may be loaded into a corresponding mount recess 1004 using motions that are orientated at angles 1022 and 1024 which are not parallel to the vertical (Y) and horizontal (X) axes.

Figure 14A:
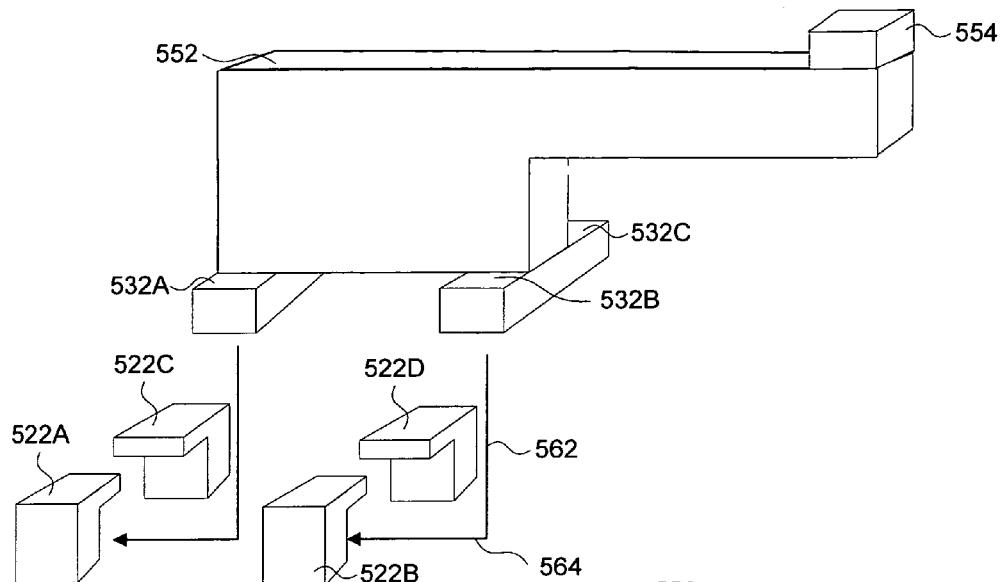
FIGS. 14A-14C depict a base structure similar to that shown in FIG. 7A along with a probe element that is configured to mate with the mount where the mating process uses a vertical motion followed by a small horizontal motion to cause loading.
Figure 14B:
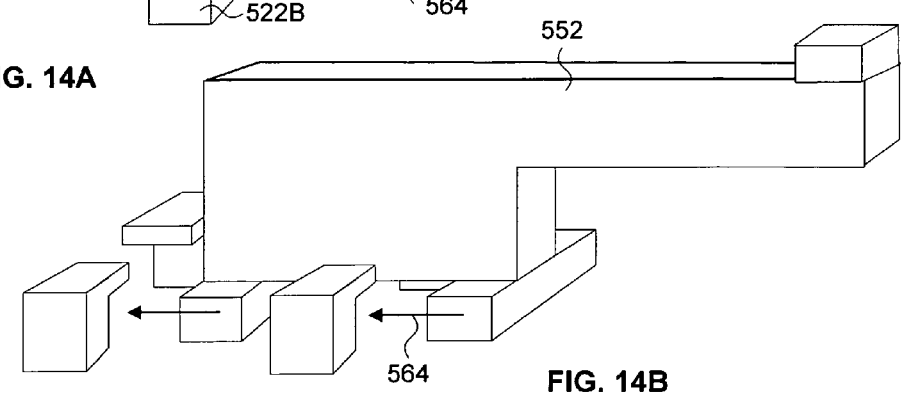
Figure 14C:
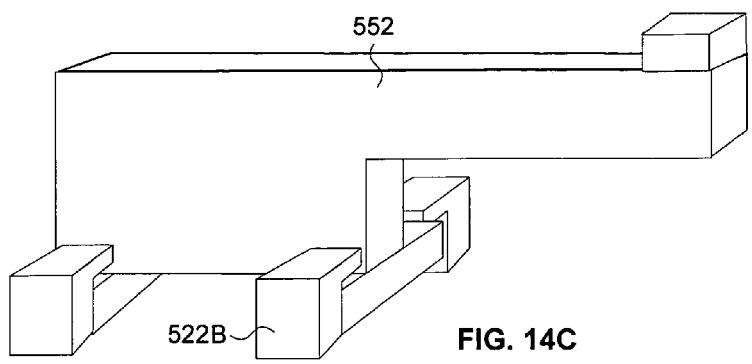

FIGS. 14A-14C depict a base structure 522A-522D similar to that shown in FIG. 7A along with a probe element 552 having a contact tip 554 and that is configured to mate, via feet 532A-532D, (532D is not visible) with the mount 522A-522D where the mating process uses a vertical motion 562 followed by a small horizontal motion 564 where the horizontal motion is substantially less than the horizontal length of the probe (e.g. less than 50% the length of the probe, more preferably less than 25% of the length of the probe, and more preferably less than 10% of the length of the probe. The required horizontal loading distance is preferrrably less than a distance that would significant interfere with the loading of all probes into all mounts particularly as the loading density of the probes increases.

FIG. 15-17 depicts side views of additional embodiments of probe mounts and probes that can be mated and locked together where FIG. 15 shows a probe as having a plurality of elastic fingers that can mat with a corresponding recession in a mount and FIGS. 16 and 17 show bases containing openings for receiving probe legs or posts and where the base includes compliant elements for holding the probe and base together. The probe 112 of FIG. 15 includes lower post portions 1114 (elastic fingers) and 1118 (guide bar) along with a gap 1116 between them to mate with mount 1102 including recesses 1104, guide opening 1108, and separating post 1106.

The probe 1152 of FIG. 16 includes post extensions 1154 and 1156 separated by a gap which respectively interface with openings 1144 and 1146 in mount 1142. Mount 1142 also include a retention element 1148 which may for example be a spring-like structure.

The probe 1172 of FIG. 17 includes post extensions 1174 and 1178. From extension 1174 a finger 1176 which can engage in a slot 1166 in opening 1164 in mount 1162. Mount 1162 also includes a second opening 1166 for engaging post extension 1178. As can be seen in FIGS. 16 and 17, the compliant elements 1168 and 1148 may be located on the rear portion of a mount or on a forward portion. In alternative embodiments the compliant elements 1148 and 1168 may be located in other areas of the mount or even located on the probe itself.

Figure 18A:
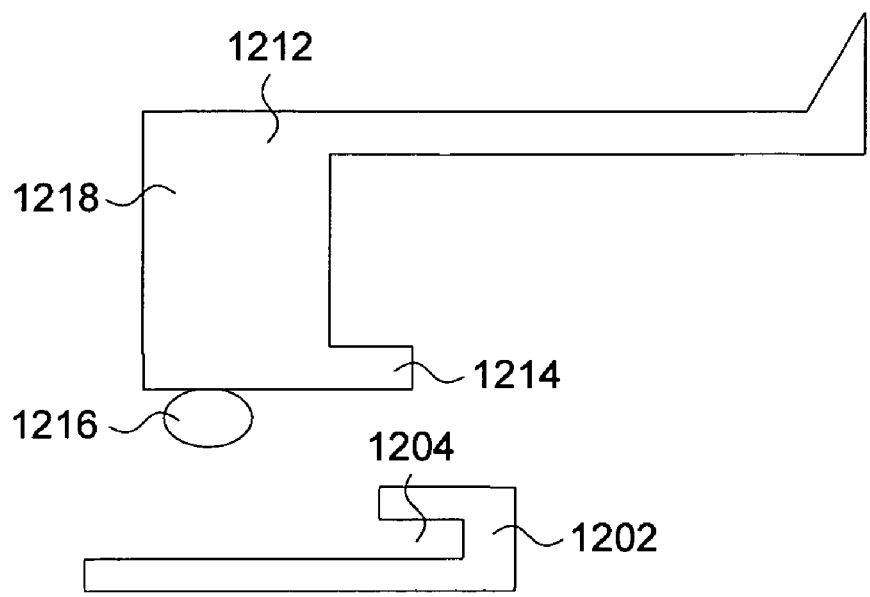
FIGS. 18A and 18B depict separate and mounted views of a probe and a base according to another embodiments of the invention where the probe includes a bonding material on a rear surface of its post and an extension on its forward surface for locking into a recession in the base.
Figure 18B:
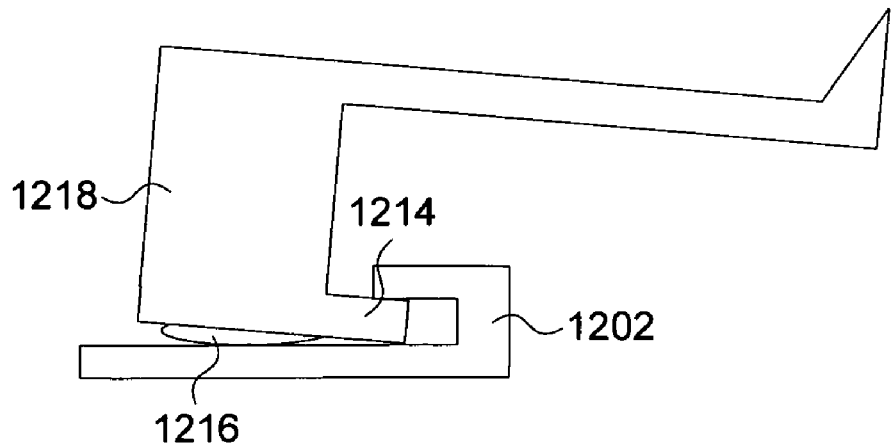

FIGS. 18A and 18B depict separate and mounted views of a probe 1212 and a mount 1202 according to another embodiment of the invention where the probe 1212 includes a bonding material 1216 (such as solder) on a rear surface of its post 1218 and an extension 1214 on its forward surface for locking into a recession i1204 n the mount 1202.

Figure 19A:
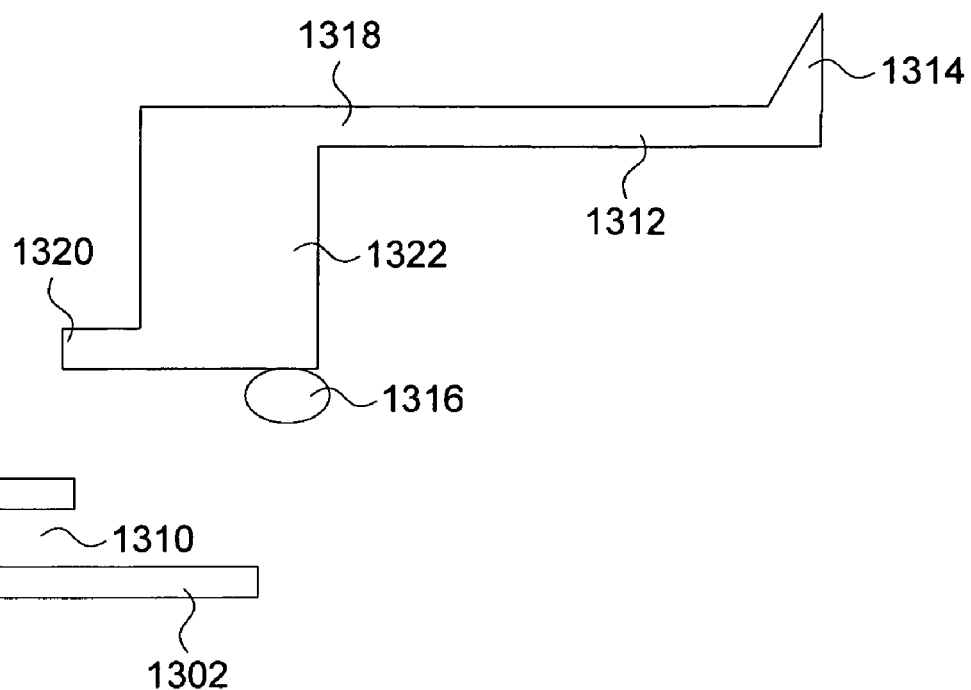
FIGS. 19A and 19B depict a similar alternative embodiment to that of FIGS. 18A and 18B with the exception that the bonding material is on a forward surface of the post of the probe while an extension is on its rear surface for locking into a recession in the base.
Figure 19B:
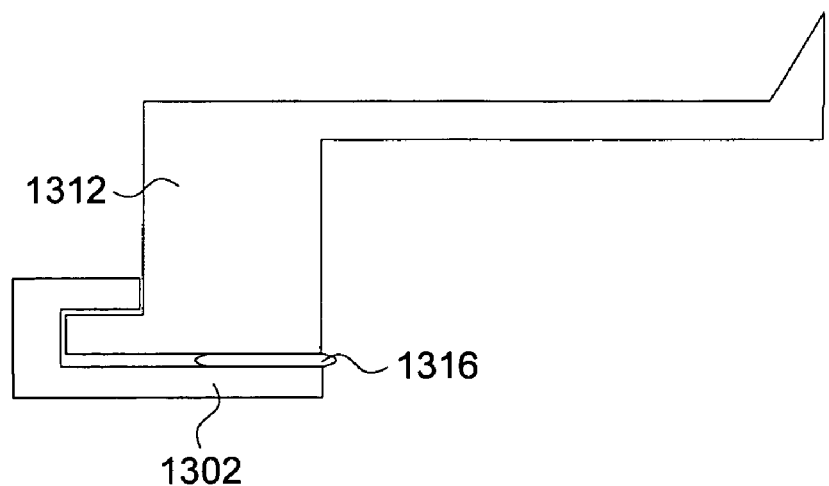

FIGS. 19A and 19B depict a similar alternative embodiment to that of FIGS. 18A and 18B with the exception that the bonding material 1318 is on a forward surface of the post 1322 of the probe 1312 while an extension 1320 is on its rear surface for locking into a recession 1310 in the base. As indicated the prove also includes a tip 1314 and a cantilever element 1318

Figure 20:
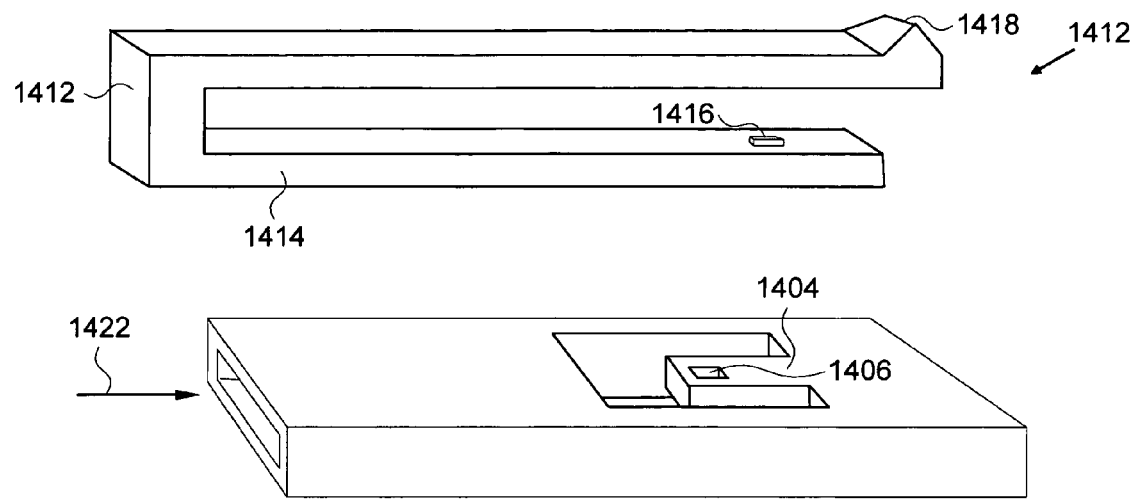
FIG. 20 shows another embodiment where the probe and base are shown separated and where the probe includes an extended base element having a locking tap which can engage with an opening in a cantilevered retention arm on the mount.

FIG. 20 shows another embodiment where probe 1412 and mount 1402 are shown separated and where the probe includes an extended base element 1414 connected to a post 1412 which connects to a cantilever portion which in turns connects to a tip 1418. The extended base element has a locking tab 1416 which can engage with an opening in a cantilevered retention arm on the mount.

Figure 21A:
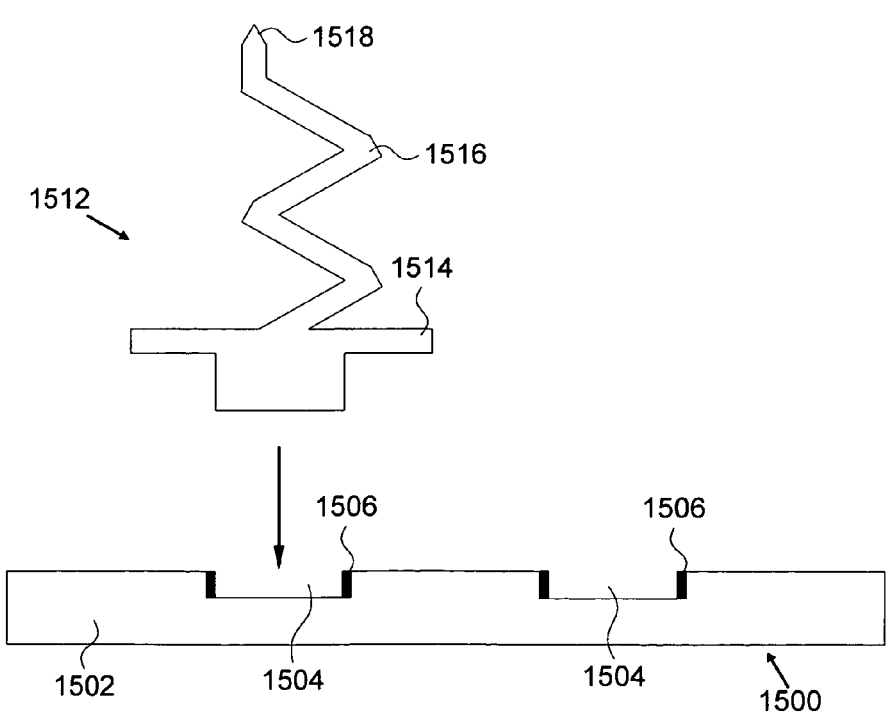
FIGS. 21A-21C depict various mount elements that include multiple recessions, i.e. sockets for receiving probes where the inside portions of the sockets are coated with a conductive material.
Figure 21B:
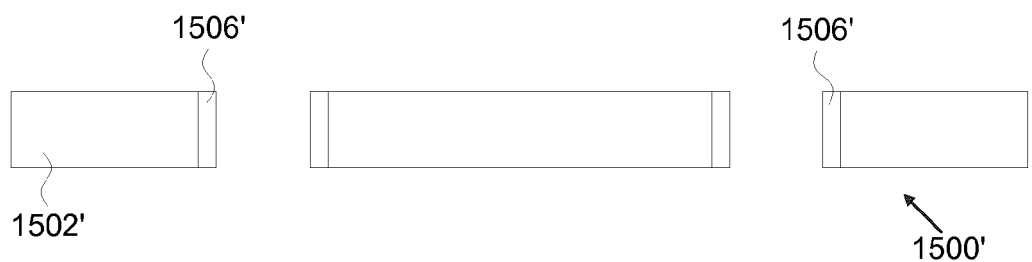
Figure 21C:
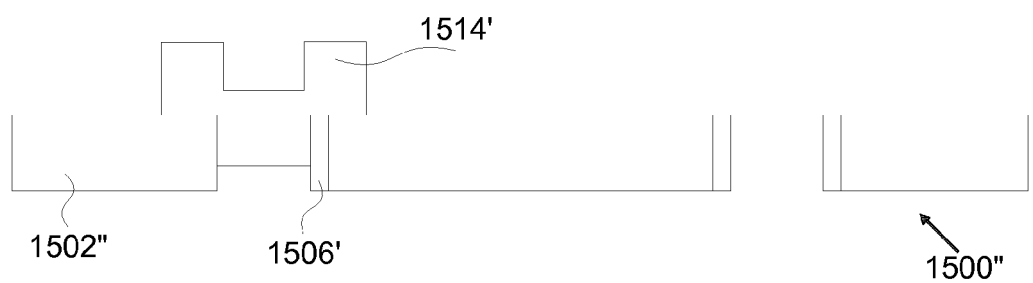

FIG. 21A-21C depict various mount elements that include multiple recessions, i.e. sockets for receiving probes where the inside portions of the sockets are coated with a conductive material.

Figure 22:
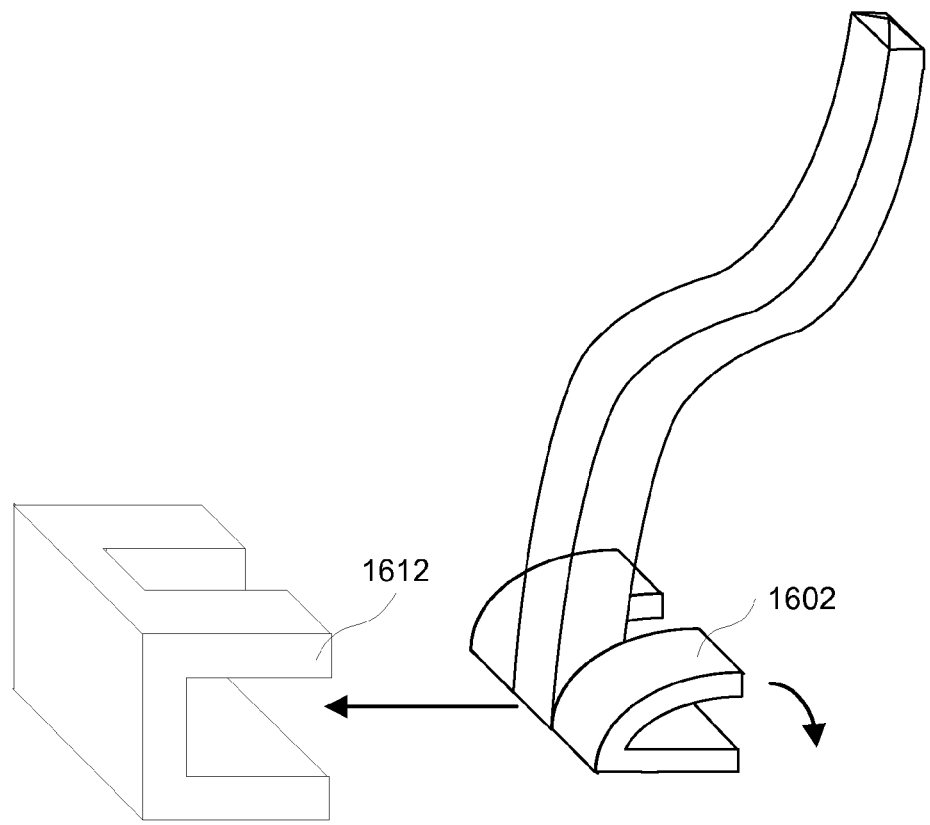
FIG. 22 depicts an alternative probe and mount configuration that may be used in some embodiments where the probe as a more verticial configuration.

FIG. 22 depicts an alternative probe and mount configuration that may be used in some embodiments where the probe as a more verticial configuration.

Figure 23:
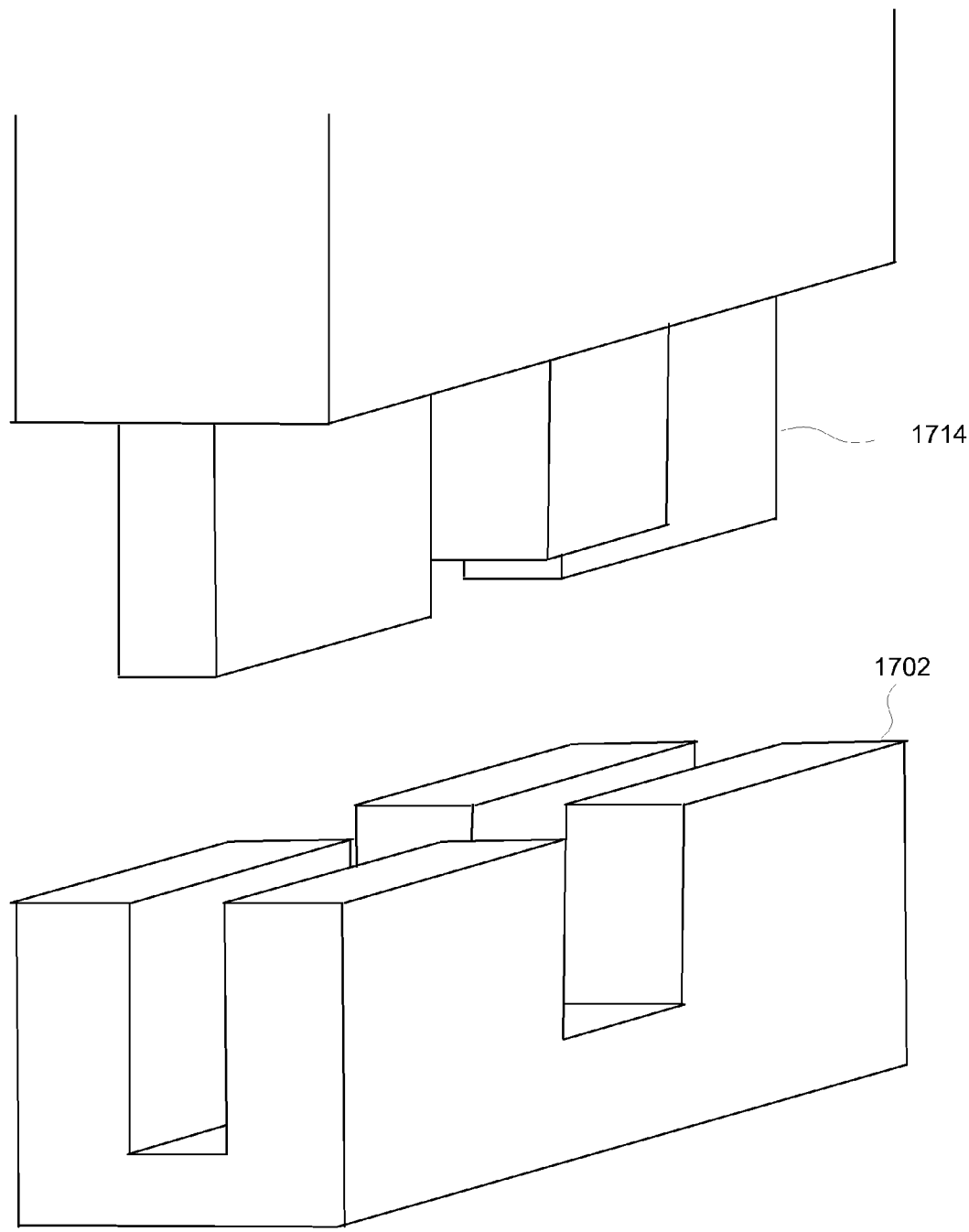
FIG. 23 depicts an alternative probe post and mount configuration that may be used according to some embodiments of the invention.

FIG. 23 depicts an alternative probe post and mount configuration that may be used according to some embodiments of the invention.

FIG. 24 includes a probe base/post configuration and mount configuration that allows for vertical loading followed by a twisting motion that locks the probe and the mount together.

Figure 25:
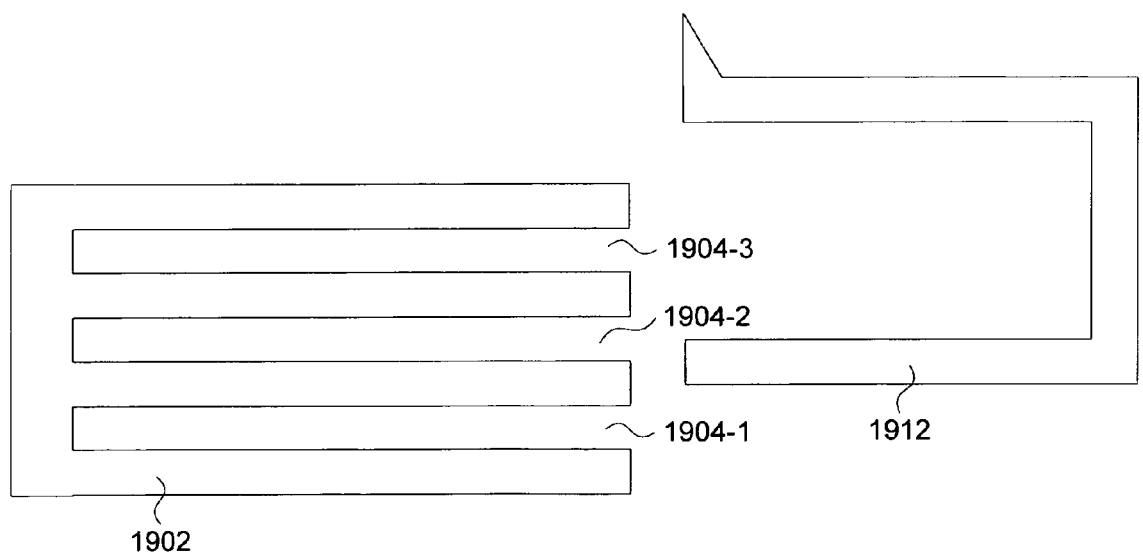
FIG. 25 depicts a further alternative embodiments where a base structure is provided with multiple probe mounting locations which may be selected between when a particular probe is to be loaded into the mount.

FIG. 25 depicts a further alternative embodiments where a base structure is provided with multiple probe mounting locations which may be selected between when a particular probe is to be loaded into the mount.

In still other embodiments, contact between the base structure and the probe element may occur by spring-like elements that may be forced into compression or tension during the loading of the probe element and which force may be used to constrain the probe element from further motion once located in its desired position.

In still other embodiments no locking elements may be necessary but it may be desirable to include fixed stop elements located on the probe and or base element that can interact with the other components and which may be used to fix and/or detect proper seating position once the probe is loaded into the base. In the various embodiments of the invention discussed above, loading of probe elements into base structures occurs by linear motion by the mating of a slot or clips and a rail-like element.

In other embodiments, however, probe structures and base structures may be designed to allow insertion and retention by rotational motion with or without linear motion. Such rotational motion may occur along an axis parallel to the Z direction or alternatively it may occur along an axis of rotation perpendicular to the Z direction (e.g. a 30°-90° rotation along the X- or Y-axis). An examples of such a mount and corresponding probe base/post shown in FIG. 24.

In still other embodiments, the rail-like structure forming or on the base of the probe may be replaced by tabs. In still other embodiments, the rail-like structure on or forming the base of the probe may be moved to the substrate while clips or retention structures may be moved to the base of the probe.

As with other embodiments of probe structures, the contact portion of the probe structure may be formed from a different material than the rest of the structure or it may alternatively be formed from the same material. The configuration of the tip may occur via the same process that is used to form the rest of the probe structure or alternatively may involve the use of a different process which may occur before, after, or in parallel to the formation of the rest of the structure and which may be bonded to the rest of the structure during formation or may be transferred after formation of both the tip element and the rest of the probe structure. In use of the probe elements of some embodiments, it will typically be desired to have arrays of probe elements which may be located in close proximity to one another and for which different properties may be desired. As such, it may be preferential in some embodiments to mix and match probe designs with one another to achieve various results such as desired spacing between elements or desired probe tip location in a given plane or desired probe tip locations in multiple planes.

In some embodiments of the invention special tip structures may be bonded to fabricated probe bodies or alternatively probe bodies may be formed upside down and the probe bodies (e.g. structurally compliant portion of the probes) may be formed on the tip as build up begins. In still other embodiments, tip coating material may be deposited onto the tip portion of the probe or onto the whole probe after it is formed. In still other embodiments, material deposited and patterned during formation of the probe may be used as tip material. For example the layer or layers of the probe may be considered the tip and these layers may simply be made from tip material.

Additional two part probe embodiments are possible. In some such embodiments, the probes may take a cantilever form or a more vertical form. Cantilever probes may take on a variety of configurations including probes with one or more post elements, probes with one or more joined or un-joined cantilever segments, or with one or more contact tips. The various cantilever designs presented herein In some embodiments, probes may be formed in an upright position, an upside-down position, or on their sides.

In some embodiments, probe mounts (i.e. the portion of the probe that is initially separated from the probe body and to which the probe body will be attached after alignment and mounting) may be formed on their side, right side up or upside-down, they maybe formed on a permanent substrate or a temporary substrate and then transferred to a permanent substrate. That may be formed in groups which have desired relative positions for batch mounting or they may be formed and thereafter placed in relative alignment for batch mounting, or they may be during mounting. In various embodiments, probe mounts may be made from one or more materials which may be the same as or different from the materials from which the probe is made. In some embodiments both the probes and the mounts will be formed using electrochemical fabrication methods while in other embodiments they may be formed using other techniques.

In some embodiments, the probes will be permanently mounted in their sockets while in other cases they will be releasably mounted. In some cases a combination of mounting methods may be employed. In the case of releasably mounted probes it will probably be easier to replace those than permanently mounted probes as well.

The mounting approaches of the invention may be applied to each of cantilever probes, vertical probes, and pin probes. Loading of probes into bases may occur by horizontally sliding in (assuming the substrate surface is horizontally orientated), tilting and sliding in, heating the base or cooling the probe and sliding in, vertical insertion, vertical insertion and twisting, vertical insert and horizontal jog (e.g. small horizontal movement relative to the dimension of the probe in the direction of movement).

Holding of probes to bases may occur by mechanical interlocking, interference fitting (e.g. where loading occurs by establishing a temperature differential), solder, gold-gold bonding, adhesive, laser welding, ultrasonic bonding, thermo-sonic bonding, thermo-pressure bonding embodiments, or the like.

Mounts and/or probes may include locking mechanisms, alignment mechanisms, release mechanisms, or the like.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al. which is entitled "Method of Electrochemically Fabricating Multilayer Structures Having Improved Interlayer Adhesion" and which is hereby incorporated herein by reference as if set forth in full.

Further teachings about microprobes and electrochemical fabrication techniques are set forth in a number of U.S. Patent Applications: (1) U.S. Patent Application No. 60/533,975 by Kim et al., which was filed on Dec. 31, 2003, and which is entitled "Microprobe Tips and Methods for Making"; (2) U.S. Patent Application No. 60/533,947 by Kumar et al., which was filed on Dec. 31, 2003, and which is entitled "Probe Arrays and Method for Making"; (3) U.S. Patent Application No. 60/574,737 by Cohen et al., which was filed May 26, 2004, and which is entitled "Electrochemical Fabrication Method for Fabricating Space Transformers or Co-Fabricating Probes and Space Transformers",; (4) U.S. Patent Application No. 60/533,897 by Cohen et al. which was filed on Dec. 31, 2003, and which is entitled "Electrochemical Fabrication Process for Forming Multilayer Multimaterial Microprobe structures"; (5) U.S. Patent Application No. 60/540,511 by Kruglick et al., which was filed on Jan. 29, 2004, and which is entitled "Electrochemically Fabricated Microprobes", (6) U.S. patent application Ser. No. 10/772,943, by Arat et al., which was filed Feb. 4, 2004, and which is entitled "Electrochemically Fabricated Microprobes"; (7) U.S. Patent Application No. 60/582,690, filed Jun. 23, 2004, by Kruglick, and which is entitled "Cantilever Microprobes with Base Structures Configured for Mechanical Interlocking to a Substrate"; and (8) U.S. Patent Application No. 60/582,689, filed Jun. 23, 2004 by Kruglick, and which is entitled "Cantilever Microprobes with Improved Base Structures and Methods for Making the Same";. These patent filings are each hereby incorporated herein by reference as if set forth in full herein.

The techniques disclosed explicitly herein may also benefit by combining them with the techniques disclosed in U.S. patent application Ser. No. 11/029,180 filed Jan. 3, 2005 by Chen et al. and entitled "Pin-Type Probes for Contacting Electronic Circuits and Methods for Making Such Probes"; U.S. Patent Application No. 60/641,341 filed Jan. 3, 2005 by Chen et al. and entitled "Vertical Microprobes for Contacting Electronic Components and Method for Making Such Probes"; U.S. patent application Ser. No. 11/029,217 filed Jan. 3, 2005 by Kim et al. and entitled "Microprobe Tips and Methods For Making"; U.S. patent application Ser. No. 11/028,958 filed Jan. 3, 2005 by Kumar et al. and entitled "Probe Arrays and Methods for Making"; and U.S. patent application Ser. No. 11/029,221 filed Jan. 3, 2005 by Cohen et al. and entitled "Electrochemical Fabrication Process for Forming Multilayer Multimaterial Microprobe Structures".

Further teachings about planarizing layers and setting layers thicknesses and the like are set forth in the following U.S. Patent Applications which were filed Dec. 31, 2003: (1) U.S. Patent Application No. 60/534,159 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 by Cohen et al. and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein.

The techniques disclosed explicitly herein may benefit by combining them with the techniques disclosed in U.S. patent application Ser. No. 11/029,220 filed Jan. 3, 2005 by Frodis et al. and entitled "Method and Apparatus for Maintaining Parallelism of Layers and/or Achieving Desired Thicknesses of Layers During the Electrochemical Fabrication of Structures".

Additional teachings concerning the formation of structures on dielectric substrates and/or the formation of structures that incorporate dielectric materials into the formation process and possibility into the final structures as formed are set forth in a number of patent applications: (1) U.S. Patent Application No. 60/534,184, by Cohen, which as filed on Dec. 31, 2003, and which is entitled "Electrochemical Fabrication Methods Incorporating Dielectric Materials and/or Using Dielectric Substrates"; (2) U.S. Patent Application No. 60/533,932, by Cohen, which was filed on Dec. 31, 2003, and which is entitled "Electrochemical Fabrication Methods Using Dielectric Substrates"; (3) U.S. Patent Application No. 60/534,157, by Lockard et al., which was filed on Dec. 31, 2004, and which is entitled "Electrochemical Fabrication Methods Incorporating Dielectric Materials"; (4) U.S. Patent Application No. 60/574,733, by Lockard et al., which was filed on May 26, 2004, and which is entitled "Methods for Electrochemically Fabricating Structures Using Adhered Masks, Incorporating Dielectric Sheets, and/or Seed Layers that are Partially Removed Via Planarization"; and U.S. Patent Application No. 60/533,895, by Lembrikov et al., which was filed on Dec. 31, 2003, and which is entitled "Electrochemical Fabrication Method for Producing Multilayer Three-Dimensional Structures on a Porous Dielectric".

These patent filings are each hereby incorporated herein by reference as if set forth in full herein.

The techniques disclosed explicitly herein may benefit by combining them with the techniques disclosed in U.S. patent application Ser. No. 11/029,216 filed Jan. 3, 2005 by Cohen et al. and entitled "Electrochemical Fabrication Methods Incorporating Dielectric Materials and/or Using Dielectric Substrates" and U.S. Patent Application No. 60/641,292 filed January 3,2005 by Dennis R. Smalley and entitled "Method of Forming Electrically Isolated Structures Using Thin Dielectric Coatings".

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S. patent application No., Filing Date U.S. application Pub No., Pub Date | Inventor, Title |
|---|---|
| 09/493,496 - Jan. 28, 2000 | Cohen, "Method For Electrochemical Fabrication" |
| 10/677,556 - Oct. 1, 2003 | Cohen, "Monolithic Structures Including Alignment and/or Retention Fixtures for Accepting Components" |
| 10/830,262 - Apr. 21, 2004 | Cohen, "Methods of Reducing Interlayer Discontinuities in Electrochemically Fabricated Three-Dimensional Structures" |
| 10/271,574 - Oct. 15, 2002 2003-0127336A - Jul. 10, 2003 | Cohen, "Methods of and Apparatus for Making High Aspect Ratio Microelectromechanical Structures" |
| 10/697,597 - Dec. 20, 2002 | Lockard, "EFAB Methods and Apparatus Including Spray Metal or Powder Coating Processes" |
| 10/677,498 - Oct. 1, 2003 | Cohen, "Multi-cell Masks and Methods and Apparatus for Using Such Masks To Form Three-Dimensional Structures" |
| 10/724,513 - Nov. 26, 2003 | Cohen, "Non-Conformable Masks and Methods and Apparatus for Forming Three-Dimensional Structures" |
| 10/607,931 - Jun. 27, 2003 | Brown, "Miniature RF and Microwave Components and Methods for Fabricating Such Components" |
| 10/841,100 - May 7, 2004 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179A - Dec. 25, 2003 | Bang, "Methods of and Apparatus for Molding Structures Using Sacrificial Metal Patterns" |
| 10/434,103 - May 7, 2004 2004-0020782A - Feb. 5, 2004 | Cohen, "Electrochemically Fabricated Hermetically Sealed Microstructures and Methods of and Apparatus for Producing Such Structures" |
| 10/841,006 - May 7, 2004 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 | Smalley, "Methods of and Apparatus for Electrochemically Fabricating Structures Via Interlaced Layers or Via Selective Etching and Filling of Voids" |
| 10/724,515 - Nov. 26, 2003 | Cohen, "Method for Electrochemically Forming Structures Including Non-Parallel Mating of Contact Masks and Substrates" |
| 10/841,347 - May 7, 2004 | Cohen, "Multi-step Release Method for Electrochemically Fabricated Structures" |
| 10/841,300 - May 7, 2004 | Cohen, "Methods for Electrochemically Fabricating Structures Using Adhered Masks, Incorporating Dielectric Sheets, and/or Seed layers That Are Partially Removed Via Planarization" |

Various other embodiments of the present invention exist. Some embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may use photoresist, polyimide, glass, ceramics, other polymers, and the like as dielectric structural materials.

It will be understood by those of skill in the art that additional operations may be used in variations of the above presented fabrication embodiments. These additional operations may, for example, perform cleaning functions (e.g. between the primary operations discussed above), they may perform activation functions and monitoring functions.

It will also be understood that the probe elements of some aspects of the invention may be formed with processes which are very different from the processes set forth herein and it is not intended that structural aspects of the invention need to be formed by only those processes taught herein or by processes made obvious by those taught herein.

Many other alternative embodiments will be apparent to those of skill in the art upon reviewing the teachings herein.

Further embodiments may be formed from a combination of the various teachings explicitly set forth in the body of this application. Even further embodiments may be formed by combining the teachings set forth explicitly herein with teachings set forth in the various applications and patents referenced herein, each of which is incorporated herein by reference.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A probe mounted to a substrate for testing semiconductor devices, comprising:
    (a) a substrate;
    (b) a mounting element affixed to the substrate;
    (c) a probe element comprising a body portion, having a distal end connected to a tip portion, and a proximal end connected to a base portion;
    wherein the base portion and the mounting element have at least some substantially complementary features which allow aligned and retained mating of the probe to the mounting element; and
    wherein the probe element and the mounting element are engaged with one another through at least two non-parallel motions of the probe element relative to both the mounting element and the substrate to which the mounting element is mounted.

2. The probe of claim 1 wherein the motions are not parallel to the X or Y axes.

3. The probe of claim 1 wherein the motions are parallel to the X and Y axes.

4. The probe of claim 1 wherein at least one of the motions comprises a rotation about an axis parallel to a plane of the substrate.

5. The probe of claim 1 wherein at least one of the motions comprises a rotation about an axis that is perpendicular to a plane of the substrate.

6. The probe of claim 1 wherein either the mounting element or the probe element includes a compliant element that engages the other of the probe element or the mounting element when the positioning of the mounting element and the probe element place them in a desired relationship.

7. The probe of claim 1 wherein either the mounting element or the probe element includes a plurality of compliant fingers that ensure interlocking of the probe element and the mounting element, wherein the fingers provide interlocking at a plurality of insertion depths between the probe and the mounting element.

* * * * *